(12) United States Patent
Tanobe et al.

(10) Patent No.: US 12,278,413 B2
(45) Date of Patent: Apr. 15, 2025

(54) HIGH-FREQUENCY LINE STRUCTURE WITH LEAD PIN-CONNECTED SUBSTRATES

(71) Applicant: Nippon Telegraph and Telephone Corporation, Tokyo (JP)

(72) Inventors: Hiromasa Tanobe, Tokyo (JP); Josuke Ozaki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 396 days.

(21) Appl. No.: 17/772,446

(22) PCT Filed: Oct. 29, 2019

(86) PCT No.: PCT/JP2019/042293
§ 371 (c)(1),
(2) Date: Apr. 27, 2022

(87) PCT Pub. No.: WO2021/084601
PCT Pub. Date: May 6, 2021

(65) Prior Publication Data
US 2022/0384928 A1    Dec. 1, 2022

(51) Int. Cl.
| | | |
|---|---|---|
| H01P 5/02 | (2006.01) | |
| H01P 1/04 | (2006.01) | |
| H01P 3/08 | (2006.01) | |
| H01P 11/00 | (2006.01) | |
| H05K 1/02 | (2006.01) | |
| H05K 3/22 | (2006.01) | |
| H05K 3/34 | (2006.01) | |

(52) U.S. Cl.
CPC ............. *H01P 5/028* (2013.01); *H01P 1/047* (2013.01); *H01P 3/081* (2013.01); *H01P 11/003* (2013.01); *H05K 1/0231* (2013.01); *H05K 1/025* (2013.01); *H05K 3/222* (2013.01); *H05K 3/3426* (2013.01)

(58) Field of Classification Search
CPC .................................. H01P 5/028; H01P 1/047
USPC ........................................................ 333/1, 33
See application file for complete search history.

(56) References Cited

U.S. PATENT DOCUMENTS

| | | | |
|---|---|---|---|
| 9,627,736 B1* | 4/2017 | Ingalls ..................... | H01P 3/088 |
| 2009/0267201 A1* | 10/2009 | Chang et al. ........... | H01L 23/66 257/664 |

OTHER PUBLICATIONS

Chen, Q. et al., "Enabling Terabit Per Second Switch Linecard Design Through Chip/Package/PCB Co-design," Proceedings of IEEE International Symposium on Electromagnetic Compatibility, Jul. 2010, 6 pages, "as described in the specification.".

(Continued)

*Primary Examiner* — Benny T Lee
(74) *Attorney, Agent, or Firm* — Slater Matsil, LLP

(57) ABSTRACT

A high-frequency line substrate is mounted on a printed circuit board. The printed circuit board includes a first high-frequency line. The high-frequency line substrate includes a second high-frequency line and lead pins that connect the first high-frequency line and the second high-frequency line. At the contact portions between the signal lead pins and the second high-frequency line of the high-frequency line substrate, and at the contact portions between the ground lead pins and the second high-frequency line of the high-frequency line substrate, the height of the ground lead pins from an upper surface of the printed circuit board is greater than the height of the signal lead pins.

13 Claims, 20 Drawing Sheets

(56) References Cited

OTHER PUBLICATIONS

Yagi, T. et al., "Development of High-speed Transmission Printed Circuit Boards," OKI Technical Review, vol. 82, No. 225, May 2015, 12 pages, "as described in the specification.".

* cited by examiner

PRIOR ART

PRIOR ART

PRIOR ART

HIGH-FREQUENCY LINE STRUCTURE WITH LEAD PIN-CONNECTED SUBSTRATES

CROSS-REFERENCE TO RELATED APPLICATIONS

This application is a national phase entry of PCT Application No. PCT/JP2019/042293, filed on Oct. 29, 2019, which application is hereby incorporated herein by reference.

TECHNICAL FIELD

The present invention relates to a high-frequency line connecting structure for mounting a bridge substrate on a printed circuit board, crossing high-frequency lines of the printed circuit board three-dimensionally, and inserting electronic components into the high-frequency lines of the printed circuit board.

BACKGROUND

When electrically connecting a plurality of various optoelectronic components on a printed circuit board having a limited area, the connections require a wider bandwidth from DC to 40 GHz. Furthermore, as seen in the recent progress of 1 Tbps optical communication technology, a wider bandwidth of 70 GHz or more is indispensable at the connections.

On the other hand, due to the economic efficiency thereof, the printed circuit board has been established as a platform used when mounting various optoelectronic components, and is widely used as a substrate on which optoelectronic components are to be mounted. When the printed circuit board is actually used, in order to prevent spatial interference between high-frequency lines and the optoelectronic components, a large number of methods have been adopted to bypass the high-frequency line to the interior of the printed circuit board, that is, an inner layer line. In such a structure where the high-frequency lines are bypassed to the inner layer line, the occurrence of an open stub is inevitable due to the nature of the structure. Traditionally, the effect of open stubs on high frequency characteristics has always been discussed.

The presence of open stubs in the high-frequency lines causes resonance due to the open stubs. Non-Patent Literature 1 discloses a transition of a stub resonance frequency to a high frequency by shortening the length of an open stub. By shortening the length of the open stub, the stub resonance frequency can be set to a frequency outside of a roll-off frequency of a pass band, which is 20 GHz or more in the example described in Non-Patent Literature 1. However, it is physically difficult to eliminate the stub resonance thereof, and the problem of roll-off of the pass characteristics due to the stub resonance remains.

On the other hand, Non-Patent Literature 2 discloses a method for shortening the length of an open stub by maximizing the machining accuracy of back drilling. However, the method disclosed in Non-Patent Literature 2 requires a high-precision processing technique, which causes a problem in that the cost of the printed circuit board increases and the economic efficiency is impaired. Therefore, it has been difficult for the prior art to realize a wide bandwidth from DC to 70 GHz without impairing economic efficiency.

The problems of the prior art are described hereinafter in more detail. FIG. 18A is a plan view of a conventional multilayer printed circuit board, and FIG. 18B is a cross-sectional view taken along line A-A' of the multilayer printed circuit board of FIG. 18A. Two high-frequency lines, a differential microstrip line 101 and a single-phase coplanar line 102 (FIG. 18A), are formed on an upper surface of a multilayer printed circuit board 100 (FIG. 18A). The single-phase coplanar line 102 is composed of a signal line 103 and a ground plane 104 formed around the signal line 103. When a multilayer printed circuit board having a limited area is used, in some cases a plurality of high-frequency lines are provided in this manner.

The single-phase coplanar line 102 is divided into two parts at a section where the single-phase coplanar line 102 intersects with the differential microstrip line 101. In order to connect the single-phase coplanar lines 102 arranged on the respective sides of the differential microstrip line 101, as shown in FIG. 18B, a structure is provided in which high-frequency signals are relayed by two vertical vias 105 of the multilayer printed circuit board 100 that are formed vertically and an inner layer line 106 of the multilayer printed circuit board 100 formed horizontally. Unnecessary parts of the vertical vias 105 are removed from a rear surface of the substrate by back drilling, which is one of the manufacturing processes of the multilayer printed circuit board.

In the example shown in FIG. 18B, holes 107 are formed by back drilling. Unfortunately, the formation of open stubs 108 is inevitable due to the limitation of machining accuracy. The presence of the open stubs 108 induces a resonance phenomenon when a high-frequency signal propagates to the inner layer line 106, affecting the pass characteristics of the single-phase coplanar line 102.

FIG. 19 is a diagram showing reflection loss characteristics in dB and passage loss characteristics in dB of the single-phase coplanar line 102 of the multilayer printed circuit board 100 at different frequencies ("FREQUENCY (GHz)"). Reference numeral 200 in FIG. 19 indicates the reflection loss characteristics, and reference numeral 201 indicates the passage loss characteristics. Due to the presence of the open stubs 108 as shown in FIG. 18B, a depression is generated in the passage loss characteristics at a specific resonance frequency (near 25 GHz in the example illustrated in FIG. 19), and the characteristics of suppressing the propagation of the high-frequency signal appear.

In order to realize a wide bandwidth from DC to 70 GHz, the stub length needs to be processed to 100 μm or less. However, in order to process the stub length to 100 μm or less, the accuracy of precision machining to obtain such a stub length that is thinner than one insulating layer constituting the multilayer printed circuit board is required, and therefore it is difficult to shorten the stub length.

Therefore, a bridge substrate on which a high-frequency line is formed is mounted on a printed circuit board on which a coplanar line intersecting with a microstrip line is formed, and the coplanar lines divided at the portion where the coplanar line intersects with the microstrip line are connected via the high-frequency line of the bridge substrate, to three-dimensionally cross the microstrip line and the coplanar line. However, in such a three-dimensional crossing method using the bridge substrate, the connection portion between the bridge substrate and the printed circuit board is exposed to the air, so that a characteristic impedance of the connection portion increases as an electrical capacitance decreases, and there exists a problem that impedance mismatch between the coplanar line of the printed circuit board and the high frequency line of the bridge substrate occurs.

Furthermore, in order to realize an electrical connection in which the passage loss and the reflection loss are sufficiently suppressed in a wide bandwidth from DC to 70 GHz, a capacitor called a so-called "DC block capacitor" is inserted in series into the high-frequency line. When such a component as a DC block capacitor is mounted on the printed circuit board using the bridge substrate, since the connection portion between the bridge substrate and the printed circuit board is exposed to the air as described above, there is a problem that impedance mismatch between the coplanar line of the printed circuit board and the high frequency line of the bridge substrate occurs.

CITATION LIST

Non-Patent Literature

Non-Patent Literature 1: Qinghua Bill Chen, Jianmin Zhang, Kelvin Qiu, Darja Padilla, Zhiping Yang, Antonio C. Scogna, Jun Fan, "Enabling Terabit Per Second Switch Linecard Design Through Chip/Package/PCB Co-design", on Proceedings of IEEE International Symposium on Electromagnetic Compatibility, July 2010, USA.

Non-Patent Literature 2: Takahiro Yagi, Kiyoshi Koike, Hiroshi Iinaga, "Development of High-speed Transmission Printed Circuit Board," OKI Technical Review, p. 36-p. 39, Vol. 82, 225, May 2015.

SUMMARY OF THE INVENTION

Technical Problem

Embodiments of the present invention may solve the foregoing problems, and an object thereof is to provide a high-frequency line connecting structure capable of suppressing impedance mismatch caused by a connection portion between a bridge substrate and a printed circuit board when connecting a high-frequency line using the bridge substrate.

Another object of embodiments of the present invention is to provide a high-frequency line connecting structure capable of suppressing impedance mismatch caused by a connection portion between a bridge substrate and a printed circuit board when mounting a component such as a DC block capacitor using the bridge substrate.

Means for Solving the Problem

A high-frequency line connecting structure of embodiments of the present invention includes a first substrate and a second substrate mounted on the first substrate, the first substrate including a first high-frequency line, the second substrate including a second high-frequency line and a lead pin made of a conductor that electrically connects the first high-frequency line and the second high-frequency line, the first high-frequency line including a first signal line formed on a first main surface of the first substrate and having a section divided into two in the middle, and a first ground formed on the first main surface of the first substrate along the first signal line and having a section where being divided into two, the section being at the same position in an extension direction as the section where the first signal line is divided, the second high-frequency line including a second signal line formed on a first main surface of the second substrate facing the first substrate so that an extension direction is parallel to the extension direction of the first signal line, and a second ground formed on the first main surface of the second substrate along the second signal line so that the extension direction is parallel to the extension direction of the first ground, the lead pin being composed of signal lead pins that are connected to both ends of the second signal line respectively so as to be in contact with one part of the first signal line and another part of the first signal line that are divided, in a state in which the second substrate is mounted on the first substrate in such a manner that the second signal line is positioned on the divided section of the first signal line and the second ground is positioned on the divided section of the first ground, and ground lead pins that are connected to both ends of the second ground respectively so as to be in contact with one part of the first ground and another part of the first ground that are divided, in a state in which the second substrate is mounted on the first substrate, wherein a height of the ground lead pin from the first main surface of the first substrate is greater than that of the signal lead pin at a contact portion between the signal lead pin and the first signal line and a contact portion between the ground lead pin and the first ground.

In one configuration example of the high-frequency line connecting structure of embodiments of the present invention, the second substrate further includes a third high-frequency line formed on a second main surface of the second substrate that is on a side opposite to the first main surface, and an electronic component mounted on the second main surface of the second substrate and inserted in series into the third high-frequency line, the third high-frequency line including a third signal line formed on the second main surface of the second substrate and having a section divided into two in the middle, and a third ground formed on the second main surface of the second substrate so as to surround the third signal line, the electronic component having two electrodes connected to one part of the third signal line and another part of the third signal line that are divided, the second signal line of the second high-frequency line including a section divided into two in the middle, the second ground of the second high-frequency line being formed so as to surround the second signal line, both ends of the third signal line being connected to one part of the second signal line and another part of the second signal line that are divided, via vias formed on the second substrate.

In one configuration example of the high-frequency line connecting structure of embodiments of the present invention, a plurality of the first signal lines of the first high-frequency line are arranged in parallel, a plurality of the first grounds of the first high-frequency line are arranged on both sides of the first signal lines along the first signal lines, a plurality of the second signal lines of the second high-frequency line are arranged in parallel, a plurality of the second grounds of the second high-frequency line are arranged on both sides of the second signal lines along the second signal lines, a plurality of the signal lead pins are arranged in parallel along an alignment direction of the first signal lines and the second signal lines, and a plurality of the ground lead pins are arranged in parallel along an alignment direction of the first grounds and the second grounds.

In one configuration example of the high-frequency line connecting structure of embodiments of the present invention, a plurality of the first signal lines of the first high-frequency line are arranged in parallel, a plurality of the first grounds of the first high-frequency line are arranged on both sides of the first signal lines along the first signal lines, a plurality of the second signal lines of the second high-frequency line are arranged in parallel, a plurality of the second grounds of the second high-frequency line are arranged so as to surround the plurality of second signal lines, a plurality of the third signal lines of the third high-frequency line are arranged in parallel, the third ground of the third high-frequency line is arranged so as to surround a plurality of the third signal lines, the electronic component is provided for each of the third signal lines, a plurality of the signal lead pins are arranged in parallel along an alignment direction of the first signal lines, the second signal lines, and the third signal lines, and a plurality of the ground lead pins are arranged in parallel along an alignment direction of the first grounds and the second grounds.

In one configuration example of the high-frequency line connecting structure of embodiments of the present invention, the electronic component is a DC block capacitor.

Effects of Embodiments of the Invention

According to embodiments of the present invention, a structure is obtained in which, at the contact portions between the signal lead pins and the first signal lines and the contact portions between the ground lead pins and the first grounds, the height of the ground lead pins from the first main surface of the first substrate is made greater than that of the signal lead pins so that the ground lead pins each functioning as a ground of a high-frequency line surround the signal lead pins. With this structure, in embodiments of the present invention, not only is it possible to prevent a decrease in capacitance between the signal lead pins and the ground lead pins, but also an increase in the characteristic impedance of the high-frequency lines can be suppressed. In embodiments of the present invention, impedance matching between the first high-frequency line of the first substrate and the second high-frequency line of the second substrate can be achieved, and a crosstalk between a signal lead pin and an adjacent signal lead pin can be reduced. As a result, embodiments of the present invention can provide a high-frequency line connecting structure capable of realizing low reflection loss characteristics, low passage loss characteristics, and low crosstalk characteristics in a wide bandwidth.

Embodiments of the present invention can also provide a high-frequency line connecting structure capable of realizing low reflection loss characteristics, low passage loss characteristics, and low crosstalk characteristics in a wide bandwidth by means of a configuration in which an electronic component is inserted in a first high-frequency line of a printed circuit board.

DETAILED DESCRIPTION OF ILLUSTRATIVE EMBODIMENTS

Embodiments of the present invention are described hereinafter in detail with reference to the drawings, where like features are denoted by the same reference labels through the detailed description of the drawings. For ease of reference, FIGS. 1-6 and 9-15 are oriented according to the Cartesian coordinate system (axes X, Y, and Z) legend illustrated in each of these figures.

First Embodiment

Figure 1:
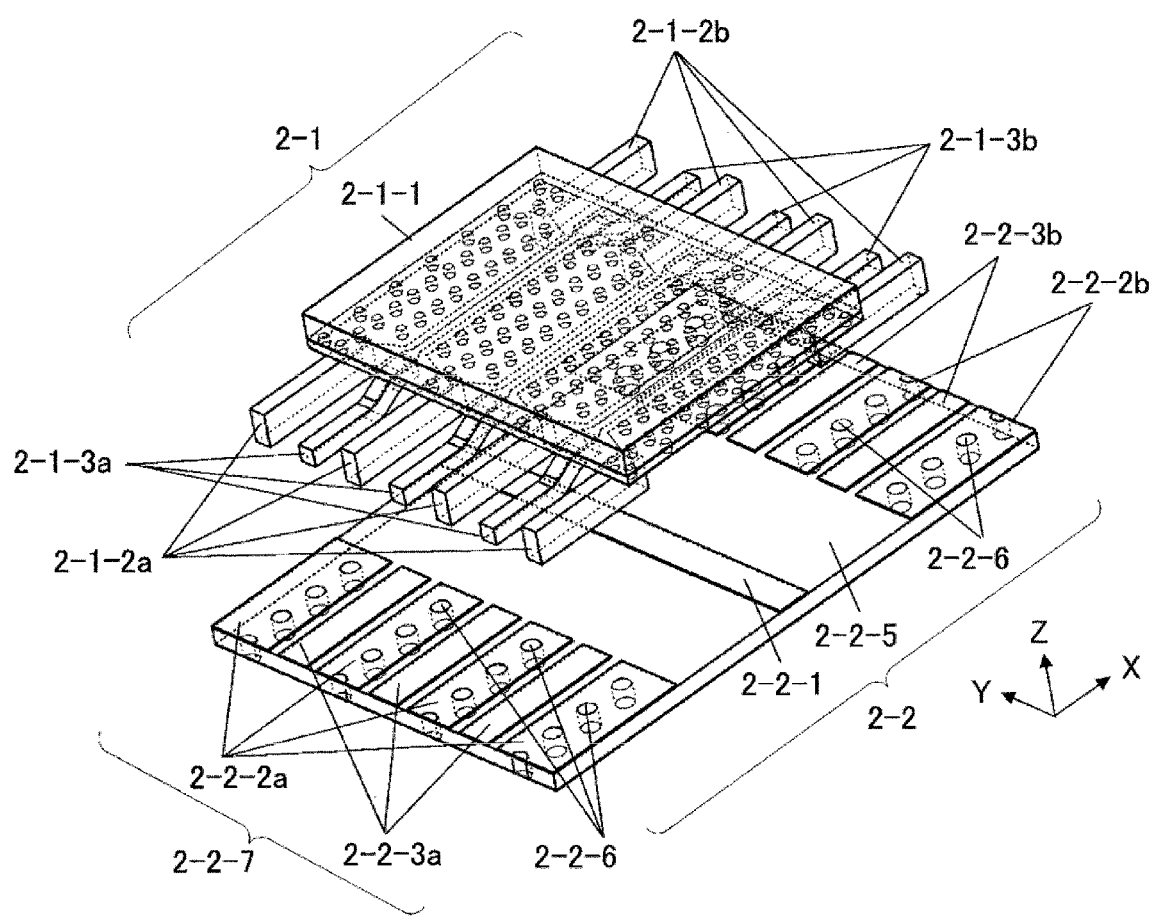
FIG. 1 is an exploded perspective view of a high-frequency line connecting structure according to a first embodiment of the present invention.
Figure 2:
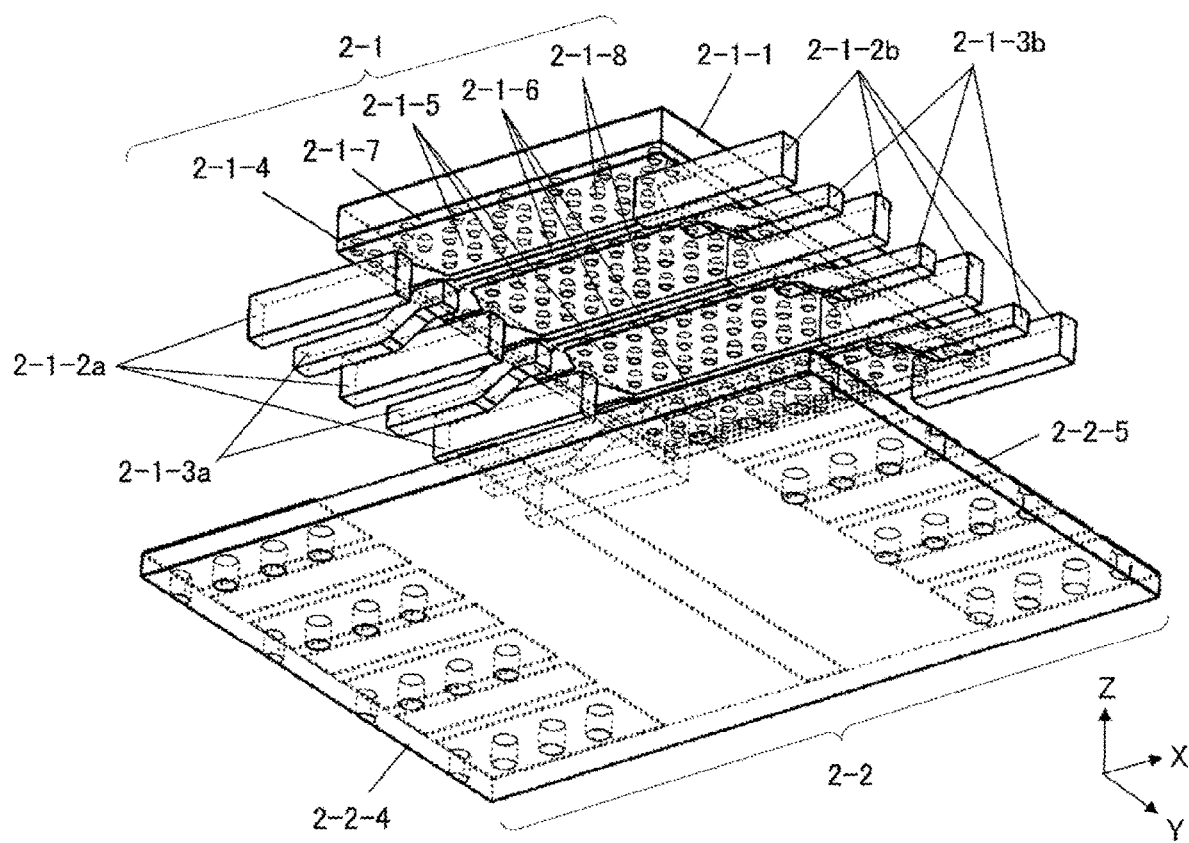
FIG. 2 is an exploded perspective view of the high-frequency line connecting structure according to the first embodiment of the present invention.

FIG. 1 is an exploded perspective view showing, from above, a high-frequency line connecting structure according to a first embodiment of the present invention, and FIG. 2 is an exploded perspective view showing the high-frequency line connecting structure from below. As shown in FIGS. 1 and 2, a printed circuit board 2-2 (first substrate) includes a flat plate-shaped dielectric 2-2-5, a microstrip line 2-2-1 (FIG. 1) made of a conductor that is formed on an upper surface (first main surface) of the dielectric 2-2-5, signal lines 2-2-3a and 2-2-3b (first signal lines) as shown in FIG.

1 made of conductors that are formed on the upper surface of the dielectric 2-2-5 along a direction intersecting with the microstrip lines 2-2-1 (FIG. 1), ground planes 2-2-2a and 2-2-2b (first grounds) as shown in FIG. 1 made of conductors that are formed on the upper surface of the dielectric 2-2-5 along the signal lines 2-2-3a and 2-2-3b (FIG. 1), a ground plane 2-2-4 (FIG. 2) made of a conductor that is formed on a lower surface (second main surface) of the dielectric 2-2-5, and ground vias 2-2-6 (FIG. 1) made of conductors that connect the ground planes 2-2-2a and 2-2-2b (FIG. 1) to the ground plane 2-2-4 (FIG. 2).

In the present embodiment, as shown in FIG. 1, a plurality of the signal lines 2-2-3a are arranged in parallel. A plurality of the ground planes 2-2-2a (FIG. 1) are arranged on both sides of the signal lines 2-2-3a along the signal lines 2-2-3a. Similarly, as shown in FIG. 1, a plurality of the signal lines 2-2-3b are arranged in parallel. A plurality of the ground planes 2-2-2b (FIG. 1) are arranged on both sides of the signal lines 2-2-3b along the signal lines 2-2-3b.

As shown in FIG. 1, the signal lines 2-2-3a and the signal lines 2-2-3b are divided at the intersections thereof with the microstrip line 2-2-1. Similarly, as shown in FIG. 1, the ground planes 2-2-2a and the ground planes 2-2-2b are divided at sections which are at the same position in an extension direction (X direction in FIGS. 1 and 2) as the sections where the signal lines 2-2-3a and 2-2-3b are divided.

The ground planes 2-2-2a and 2-2-2b (FIG. 1) are electrically connected to the ground plane 2-2-4 (FIG. 2) by the ground vias 2-2-6 (FIG. 1) formed on the dielectric 2-2-5.

The signal lines 2-2-3a and 2-2-3b shown in FIG. 1 and the ground planes 2-2-2a and 2-2-2b shown in FIG. 1 constitute a grounded coplanar line 2-2-7 (first high-frequency line) as shown in FIG. 1 having the ground plane 2-2-4 (FIG. 2) on a rear surface of the substrate. As described above, the grounded coplanar line 2-2-7 is divided at the intersection thereof with the microstrip line 2-2-1.

Figure 3:
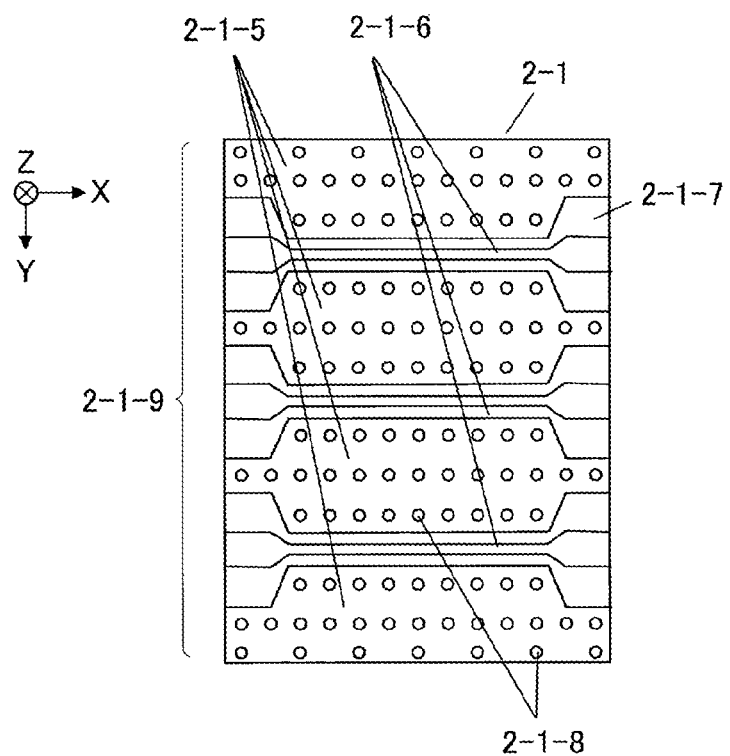
FIG. 3 is a bottom view of the high-frequency line connecting structure according to the first embodiment of the present invention.

Next is described a high-frequency line substrate 2-1 (second substrate) for connecting the divided grounded coplanar lines 2-2-7 (FIG. 1) located on both sides of the microstrip line 2-2-1 (FIG. 1). FIG. 3 is a bottom view of the high-frequency line substrate 2-1. In FIG. 3, the descriptions of the signal lead pins and the ground lead pins, which will be described later, are omitted in order to facilitate understanding of the configuration of the high-frequency line substrate 2-1.

As shown in FIGS. 1 to 3, the high-frequency line substrate 2-1 includes a flat plate-shaped dielectric 2-1-1 (FIGS. 1 and 2), a ground plane 2-1-4 (FIG. 2) made of a conductor that is formed on a lower surface of the dielectric 2-1-1 facing the printed circuit board 2-2 (FIGS. 1 and 2), a dielectric 2-1-7 (FIGS. 2 and 3) formed on a lower surface of the ground plane 2-1-4 facing the printed circuit board 2-2, a signal line 2-1-6 (second signal line) (FIGS. 2 and 3) made of a conductor that is formed on a lower surface (first main surface) of the dielectric 2-1-7 facing the printed circuit board 2-2, so that the extension direction becomes parallel to the extension direction of the signal lines 2-2-3a and 2-2-3b (FIG. 1) when the high-frequency line substrate 2-1 is mounted on the printed circuit board 2-2, and a ground plane 2-1-5 (second ground) as shown in FIGS. 2 and 3 made of a conductor that is formed on the lower surface of the dielectric 2-1-7 facing the printed circuit board 2-2, along the signal line 2-1-6, so that the extension direction becomes parallel to the extension direction of the ground planes 2-2-2a and 2-2-2b (FIG. 1) when the high-frequency line substrate 2-1 is mounted on the printed circuit board 2-2.

The high-frequency line substrate 2-1 further includes signal lead pins 2-1-3a and 2-1-3b as shown in FIGS. 1 and 2 made of conductors that are connected to both ends of the signal line 2-1-6 (FIG. 2) respectively so as to be in contact with the signal lines 2-2-3a and 2-2-3b shown in FIG. 1 when the high-frequency line substrate 2-1 is mounted on the printed circuit board 2-2, ground lead pins 2-1-2a and 2-1-2b (FIGS. 1 and 2) made of conductors that are connected to both ends of the ground plane 2-1-5 (FIGS. 2 and 3) respectively so as to be in contact with the ground planes 2-2-2a and 2-2-2b (FIG. 1) when the high-frequency line substrate 2-1 is mounted on the printed circuit board 2-2, and ground vias 2-1-8 (FIGS. 2 and 3) made of conductors that are formed in the dielectric 2-1-7 (FIGS. 2 and 3) and connect the ground plane 2-1-4 (FIG. 2) and the ground plane 2-1-5 (FIGS. 2 and 3).

Examples of the material of the dielectrics 2-1-1, 2-1-7, and 2-2-5 include low-loss ceramics such as alumina.

In the present embodiment, a plurality of the signal lines 2-1-6 (FIGS. 2 and 3) are arranged in parallel on the lower surface of the high-frequency line substrate 2-1. The pitch of the signal lines 2-1-6 in the alignment direction (Y direction in FIGS. 1 to 3) is the same as the pitch of the signal lines 2-2-3a and 2-2-3b, shown in FIGS. 1 and 2, in the alignment direction.

As shown in FIGS. 2 and 3, a plurality of the ground planes 2-1-5 are arranged on both sides of the signal lines 2-1-6 along the signal lines 2-1-6. The pitch of the ground planes 2-1-5 in the alignment direction is the same as the pitch of the ground planes 2-2-2a and 2-2-2b, shown in FIG. 1, in the alignment direction.

The ground planes 2-1-5 (FIGS. 2 and 3) are electrically connected to the ground planes 2-1-4 (FIG. 2) by the ground vias 2-1-8 (FIGS. 2 and 3) formed on the dielectric 2-1-7 (FIGS. 2 and 3).

The signal lines 2-1-6 (FIGS. 2 and 3) and the ground planes 2-1-5 (FIGS. 2 and 3) constitute a grounded coplanar line 2-1-9 (second high-frequency line) as shown in FIG. 3 having the ground plane 2-1-4 (FIG. 2) on the opposite side with the dielectric 2-1-7 (FIGS. 2 and 3) therebetween.

In the present embodiment, a plurality of the signal lead pins 2-1-3a and 2-1-3b (FIGS. 1 and 2) are arranged in parallel along the alignment direction of the signal lines 2-2-3a and 2-2-3b (FIG. 1) and the alignment direction (Y direction in FIGS. 1 to 3) of the signal lines 2-1-6 (FIGS. 2 and 3). The pitch of the signal lead pins 2-1-3a and 2-1-3b in the alignment direction is the same as the pitch of the signal lines 2-2-3a and 2-2-3b and the signal lines 2-1-6 in the alignment direction.

A plurality of the ground lead pins 2-1-2a and 2-1-2b (FIGS. 1 and 2) are arranged in parallel along the alignment direction of the ground planes 2-2-2a and 2-2-2b (FIG. 1) and the alignment direction (Y direction in FIGS. 1 to 3) of the ground planes 2-1-5 (FIGS. 2 and 3). The pitch of the ground lead pins 2-1-2a and 2-1-2b in the alignment direction is the same as the pitch of the ground planes 2-2-2a and 2-2-2b and the ground planes 2-1-5 in the alignment direction.

Examples of a method for fixing the signal lead pins 2-1-3a and 2-1-3b to the signal lines 2-1-6 and a method for fixing the ground lead pins 2-1-2a and 2-1-2b to the ground planes 2-1-5 include brazing and soldering; needless to say, other fixing methods may be adopted.

After the high-frequency line substrate 2-1 and the printed circuit board 2-2 described above are individually prepared, the high-frequency line substrate 2-1 is mounted on the printed circuit board 2-2.

Figure 4:
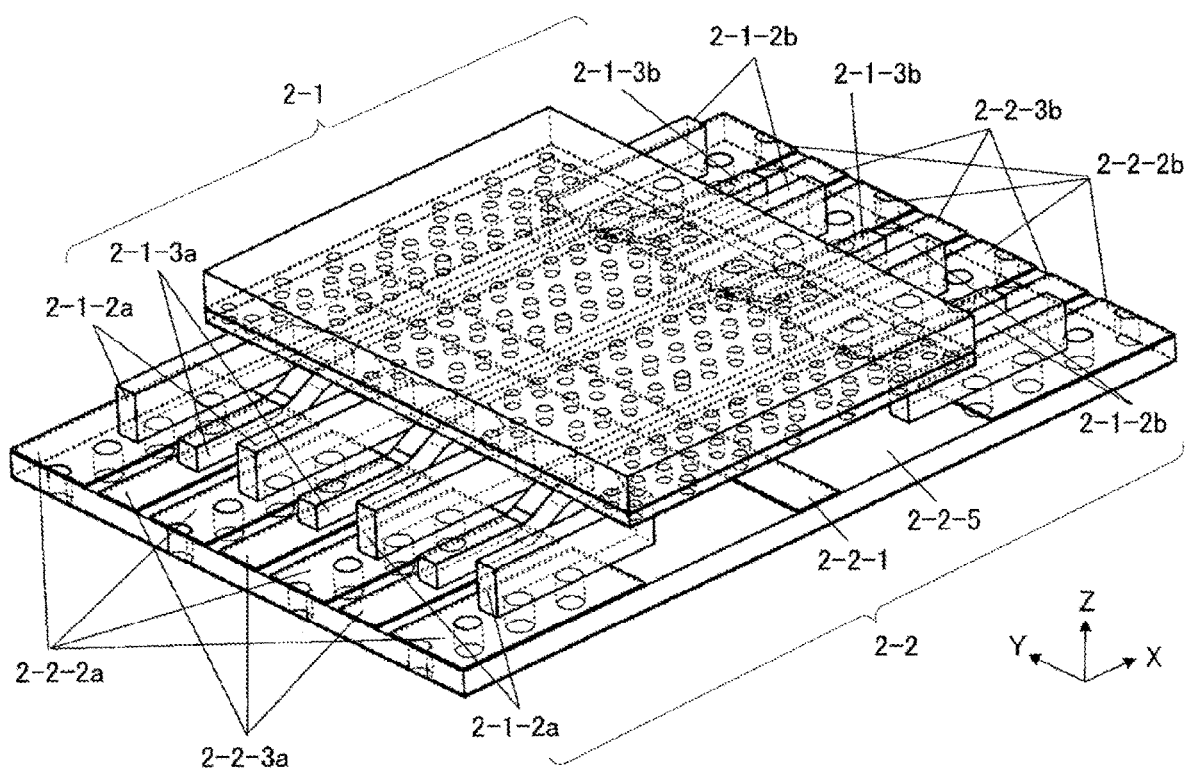
FIG. 4 is a perspective view of the high-frequency line connecting structure according to the first embodiment of the present invention.
Figure 5:
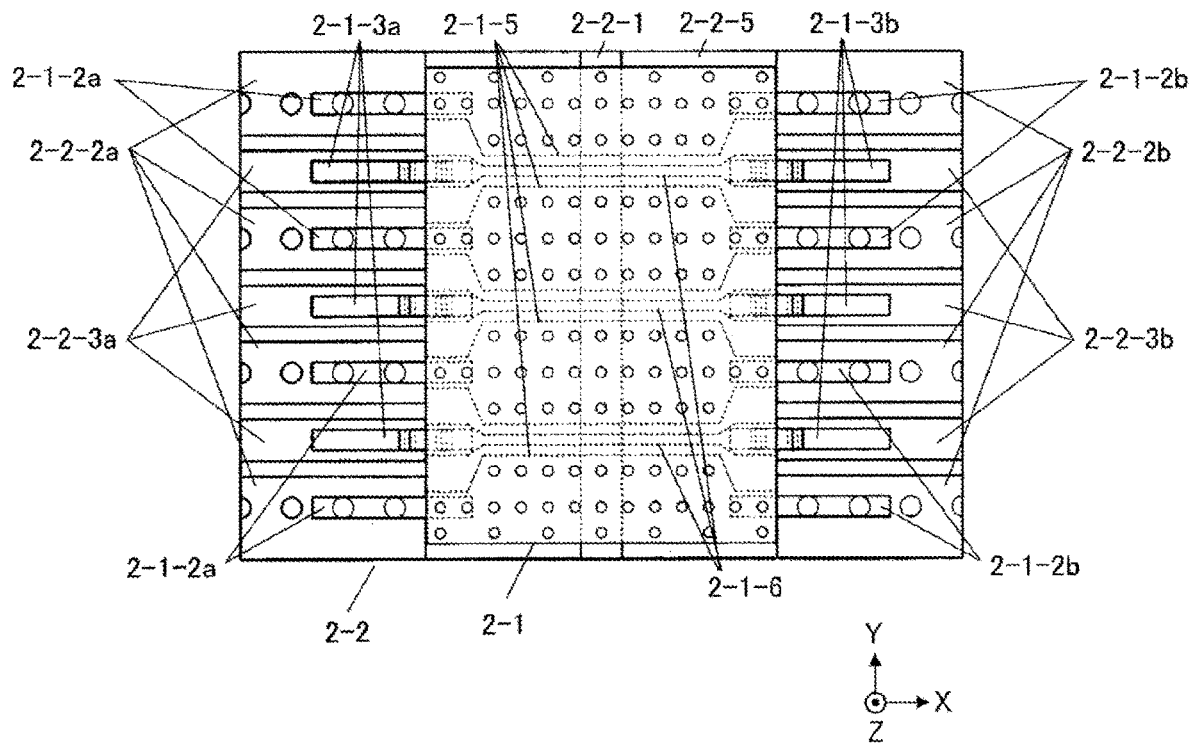
FIG. 5 is a plan view of the high-frequency line connecting structure according to the first embodiment of the present invention.

FIG. 4 is a perspective view of a high-frequency line connecting structure in which the high-frequency line substrate 2-1 is mounted on the printed circuit board 2-2, and the divided grounded coplanar lines 2-2-7 (see FIG. 1) of the printed circuit board 2-2 are connected by the grounded coplanar line 2-1-9 (see FIG. 3) of the high-frequency line substrate 2-1. FIG. 5 is a plan view of the high-frequency line connecting structure of FIG. 4, and FIG. 6 is a side view of the high-frequency line connecting structure of FIG. 4.

Figure 6:
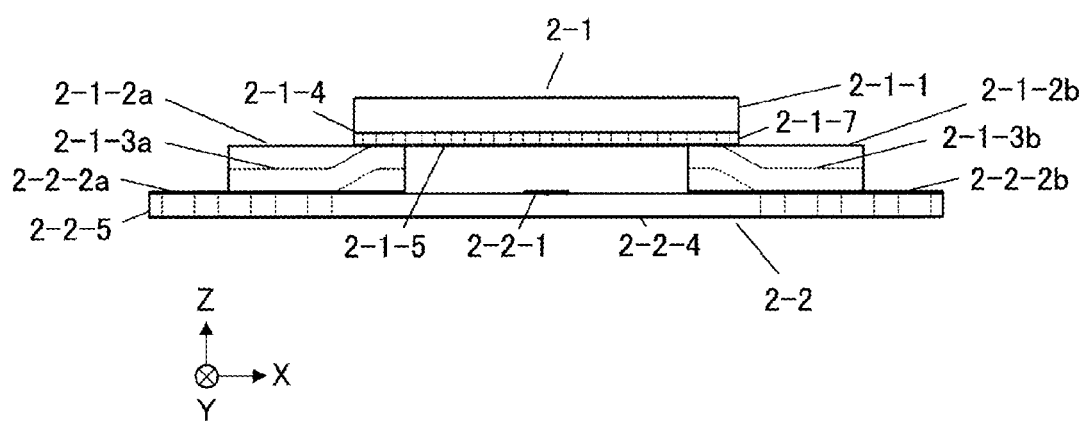
FIG. 6 is a side view of the high-frequency line connecting structure according to the first embodiment of the present invention.

In order to prepare the high-frequency line connecting structure shown in FIGS. 4 to 6, the surface of the high-frequency line substrate 2-1 on which the signal lines 2-1-6 (FIG. 5) and the ground planes 2-1-5 (FIGS. 5 and 6) are formed is placed face-down so the signal lines 2-1-6 (FIG. 5) are positioned above the divided sections of the signal lines 2-2-3a and 2-2-3b as shown in FIGS. 4 and 5 and the ground planes 2-1-5 as shown in FIGS. 5 and 6 are positioned on the divided sections of the ground planes 2-2-2a and 2-2-2b as shown in FIGS. 4-6, and then the high-frequency line substrate 2-1 is mounted on the printed circuit board 2-2.

In so doing, the high-frequency line substrate 2-1 is mounted on the printed circuit board 2-2 in such a manner that the signal lead pins 2-1-3a and 2-1-3b (FIGS. 4-6) of the high-frequency line substrate 2-1 and the signal lines 2-2-3a and 2-2-3b (FIGS. 4 and 5) of the printed circuit board 2-2 come into contact with each other, and that the ground lead pins 2-1-2a and 2-1-2b (FIGS. 4-6) of the high-frequency line substrate 2-1 and the ground planes 2-2-2a and 2-2-2b (FIGS. 4-6) of the printed circuit board 2-2 come into contact with each other.

The signal lead pins 2-1-3a and 2-1-3b of the high-frequency line substrate 2-1 and the signal lines 2-2-3a and 2-2-3b of the printed circuit board 2-2 are connected by soldering or the like. Similarly, the ground lead pins 2-1-2a and 2-1-2b of the high-frequency line substrate 2-1 and the ground planes 2-2-2a and 2-2-2b of the printed circuit board 2-2 are connected by soldering or the like.

With the high-frequency line connecting structure described above, the signal line 2-2-3a (FIGS. 4 and 5) of the printed circuit board 2-2 is electrically connected to the signal line 2-2-3b (FIGS. 4 and 5) via the signal lead pin 2-1-3a (FIGS. 4-6), the signal line 2-1-6 (FIG. 5), and the signal lead pin 2-1-3b (FIGS. 4-6) of the high-frequency line substrate 2-1. Similarly, the ground plane 2-2-2a (FIGS. 4-6) of the printed circuit board 2-2 is electrically connected to the ground plane 2-2-2b (FIGS. 4-6) via the ground lead pin 2-1-2a (FIGS. 4-6), the ground plane 2-1-5 (FIGS. 5 and 6), and the ground lead pin 2-1-2b (FIGS. 4-6) of the high-frequency line substrate 2-1. In the present embodiment, the microstrip line 2-2-1 (FIGS. 4-6) and the grounded coplanar line 2-2-7 (see FIG. 1) formed on the upper surface of the printed circuit board 2-2 can be crossed three-dimensionally.

In the present embodiment, as shown in FIG. 6, the shapes of the ground lead pins 2-1-2a and 2-1-2b and of the signal lead pins 2-1-3a and 2-1-3b are determined in such a manner that the height of the ground lead pins 2-1-2a and 2-1-2b from the upper surface of the printed circuit board 2-2 is greater than that of the signal lead pins 2-1-3a and 2-1-3b at the contact portions between the signal lead pins 2-1-3a and 2-1-3b and the signal lines 2-2-3a and 2-2-3b as shown in FIGS. 4 and 5, and the contact portions between the ground lead pins 2-1-2a and 2-1-2b and the ground planes 2-2-2a and 2-2-2b as shown in FIGS. 4-6.

As is clear from FIG. 6, needless to say, the height of upper surfaces of the signal lead pins 2-1-3a and 2-1-3b at the connection portions between the signal lead pins 2-1-3a and 2-1-3b and the signal lines 2-1-6 (FIG. 5) is the same as the height of the upper surfaces of the ground lead pins 2-1-2a and 2-1-2b at the connection portions between the ground lead pins 2-1-2a and 2-1-2b and the ground planes 2-1-5 (FIGS. 5 and 6). The signal lead pins 2-1-3a and 2-1-3b are shaped such that the upper surfaces thereof become lower in height from the high-frequency line substrate 2-1 toward the signal lines 2-2-3a and 2-2-3b (FIGS. 4 and 5), respectively.

A high-frequency signal propagates from the printed circuit board 2-2 to the high-frequency line substrate 2-1 through the signal lead pin 2-1-3a. Furthermore, a high-frequency signal propagates from the high-frequency line substrate 2-1 to the printed circuit board 2-2 through the signal lead pin 2-1-3b. In such a case, since the signal lead pins 2-1-3a and 2-1-3b are exposed to air, the capacitance between the signal lead pins 2-1-3a and 2-1-3b and the ground lead pins 2-1-2a and 2-1-2b decreases, and the characteristic impedance of the coplanar line tends to increase.

In the present embodiment, at the contact portions between the signal lead pins 2-1-3a and 2-1-3b and the signal lines 2-2-3a and 2-2-3b (FIGS. 4 and 5), and at the contact portions between the ground lead pins 2-1-2a and 2-1-2b and the ground planes 2-2-2a and 2-2-2b, the height of the ground lead pins 2-1-2a and 2-1-2b is made greater than that of the signal lead pins 2-1-3a and 2-1-3b. Thus, a structure is obtained in which the signal lead pins 2-1-3a and 2-1-3b are surrounded by the ground lead pins 2-1-2a and 2-1-2b that each function as the ground of the coplanar line.

With this structure, in the present embodiment, not only is it possible to prevent a decrease in capacitance between the signal lead pins 2-1-3a and 2-1-3b and the ground lead pins 2-1-2a and 2-1-2b, but also an increase in the characteristic impedance of the coplanar lines can be suppressed. As a result, impedance matching can be achieved between the grounded coplanar line 2-2-7 (see FIG. 1) of the printed circuit board 2-2 and the grounded coplanar line 2-1-9 (see FIG. 3) of the high-frequency line substrate 2-1.

In addition, in the present embodiment, the ground lead pins 2-1-2a and 2-1-2b can enclose a line of electric force from the signal lead pins 2-1-3a and 2-1-3b so as not to allow the line of electric force to reach the adjacent signal lead pins 2-1-3a and 2-1-3b. As a result, crosstalk between the signal lead pins 2-1-3a and 2-1-3b and the adjacent signal lead pins 2-1-3a and 2-1-3b can be reduced.

Figure 7:
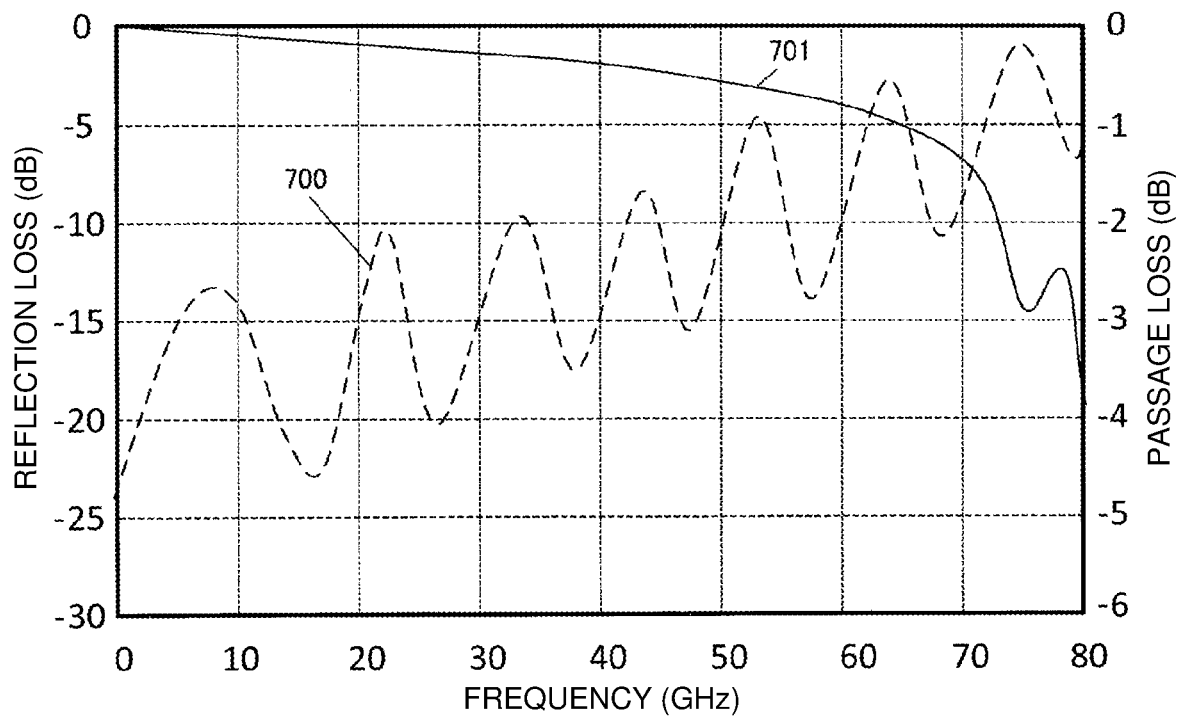
FIG. 7 is a diagram illustrating simulation results of reflection loss characteristics and passage loss characteristics of the high-frequency line connecting structure according to the first embodiment of the present invention.
Figure 8:
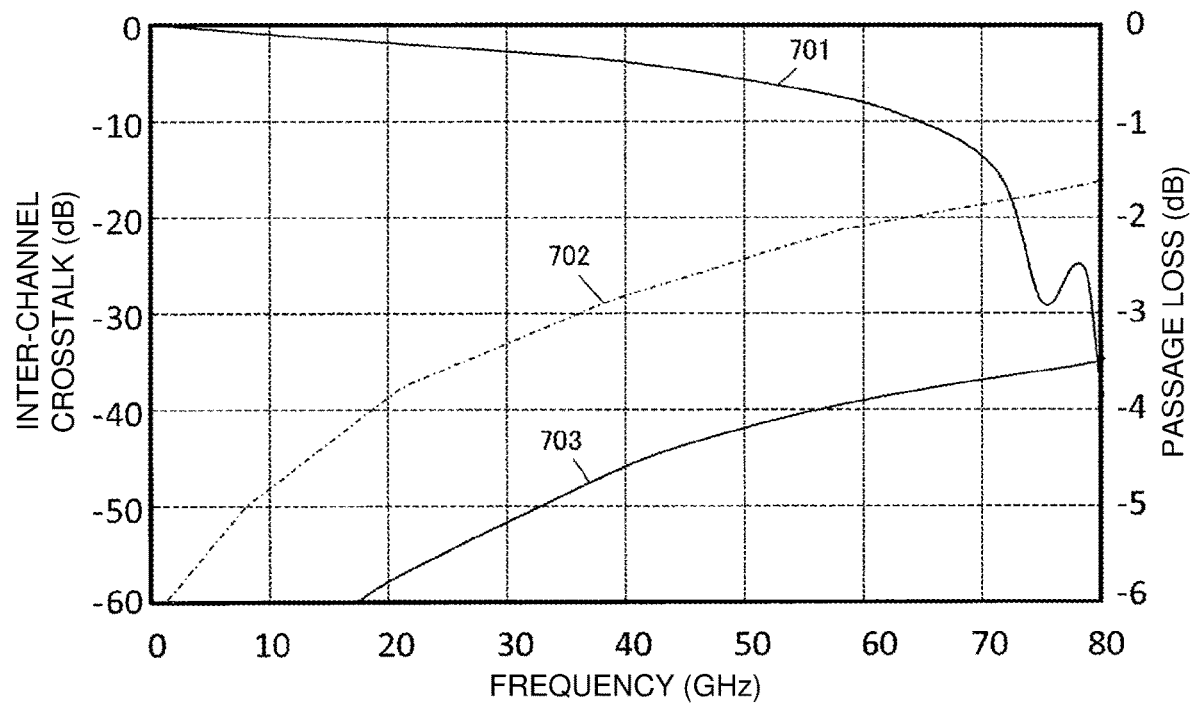
FIG. 8 is a diagram illustrating simulation results of crosstalk characteristics between adjacent channels and passage loss characteristics of the high-frequency line connecting structure according to the first embodiment of the present invention.

FIG. 7 is a diagram illustrating simulation results of reflection loss characteristics in dB and passage loss characteristics in dB of the grounded coplanar line in the high-frequency line connecting structure of the present embodiment at different frequencies ("FREQUENCY (GHz)"). FIG. 8 is a diagram illustrating simulation results of inter-channel crosstalk characteristics in dB between adjacent channels and passage loss characteristics in dB of the grounded coplanar line in the high-frequency line connecting structure of the present embodiment at different frequencies ("FREQUENCY (GHz)").

Reference numeral 700 in FIG. 7 indicates the reflection loss characteristics, and reference numeral 701 in FIGS. 7 and 8 indicates the passage loss characteristics. Reference numeral 702 of FIG. 8 indicates a crosstalk between adjacent channels occurring when the shape of the ground lead pins 2-1-2a and 2-1-2b is identical to that of the signal lead pins 2-1-3a and 2-1-3b as shown in FIG. 6, and reference numeral 703 indicates a crosstalk between adjacent channels in the present embodiment.

In the present embodiment, by mounting the high-frequency line substrate 2-1 on the printed circuit board 2-2, the grounded coplanar lines 2-2-7 (see FIG. 1) divided at the intersection thereof with the microstrip line 2-2-1 are connected via the high-frequency line substrate 2-1. Also in the present embodiment, by making the height of the ground lead pins 2-1-2a and 2-1-2b at the connection portion with the printed circuit board 2-2 greater than that of the signal lead pins 2-1-3a and 2-1-3b, impedance matching can be achieved between the grounded coplanar line 2-2-7 (see FIG. 1) of the printed circuit board 2-2 and the grounded coplanar line 2-1-9 (see FIG. 3) of the high-frequency line substrate 2-1.

As a result, in the present embodiment, the high-frequency line connecting structure capable of achieving favorable effects as shown in FIGS. 7 and 8 and realizing low reflection loss characteristics, low passage loss characteristics, and low crosstalk characteristics in a wide band can be obtained.

Second Embodiment

Figure 9:
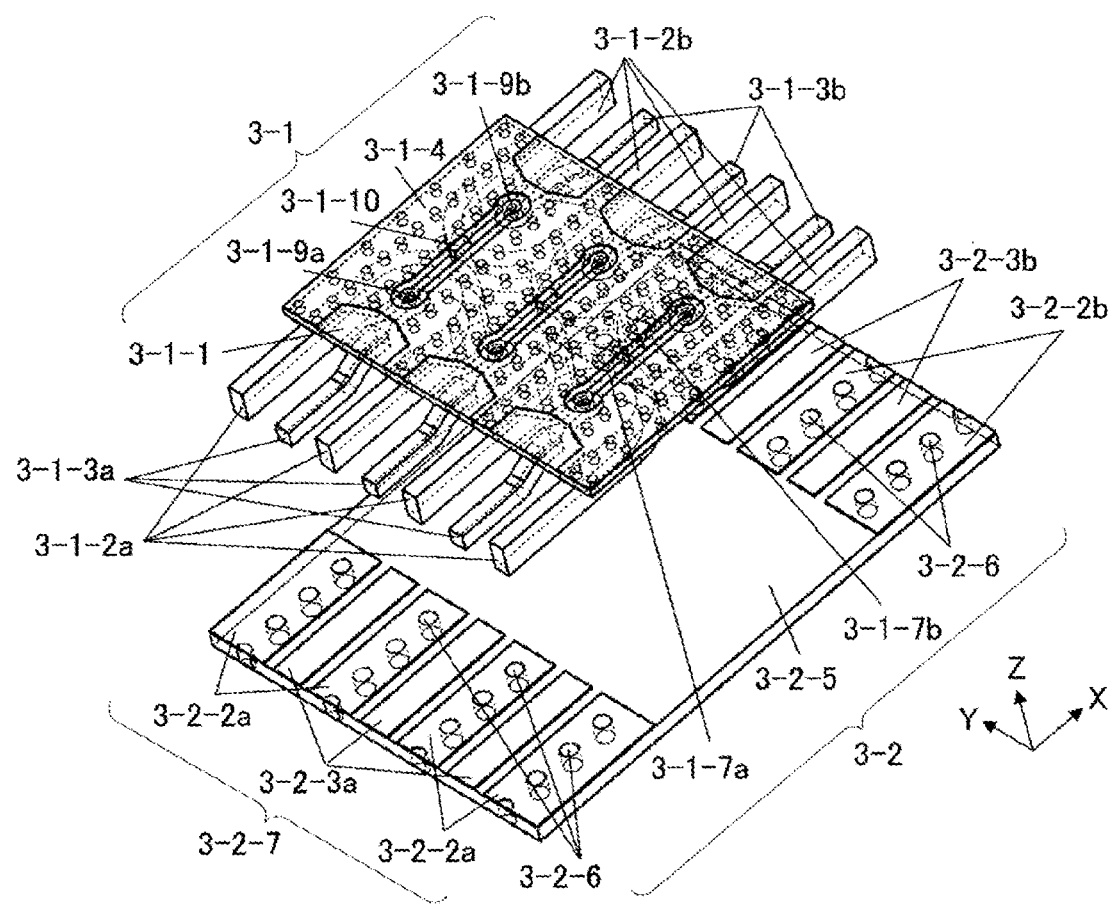
FIG. 9 is an exploded perspective view of a high-frequency line connecting structure according to a second embodiment of the present invention.
Figure 10:
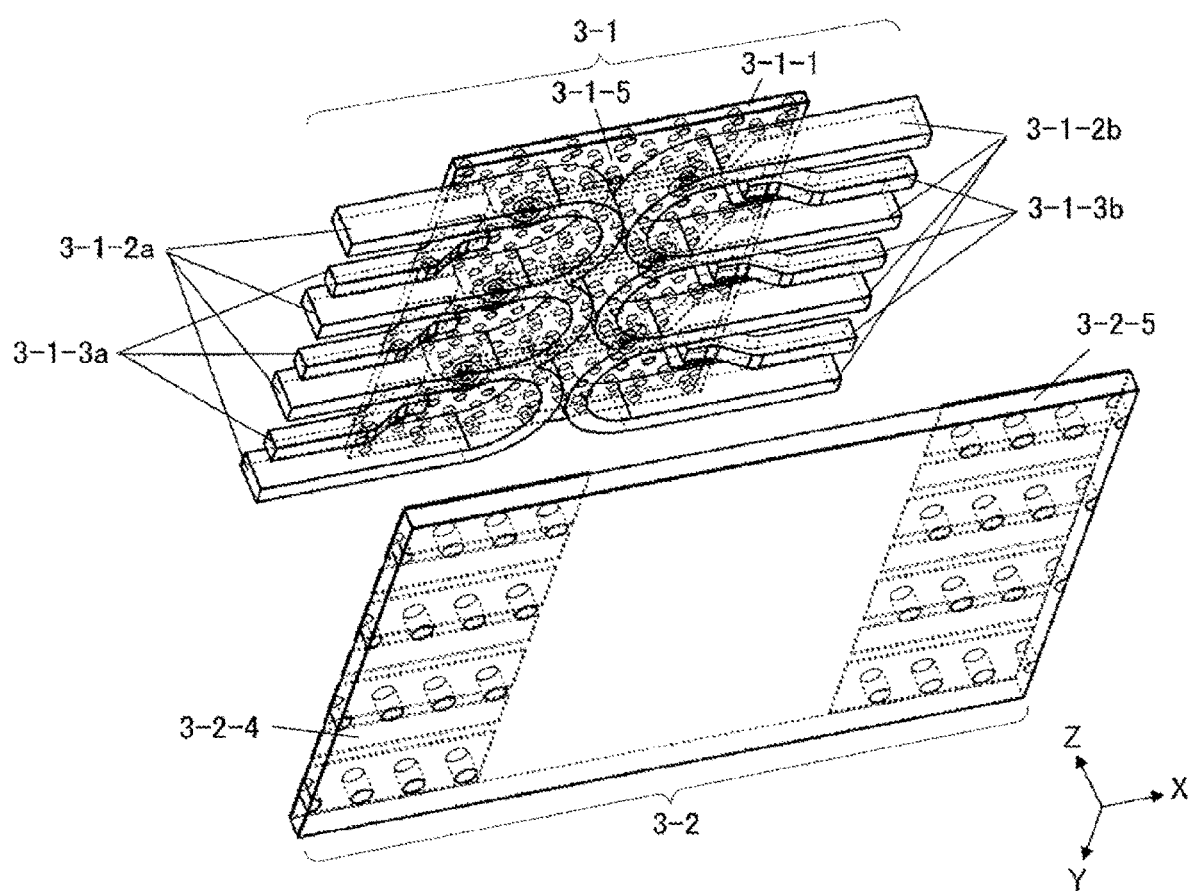
FIG. 10 is an exploded perspective view of the high-frequency line connecting structure according to the second embodiment of the present invention.
Figure 11:
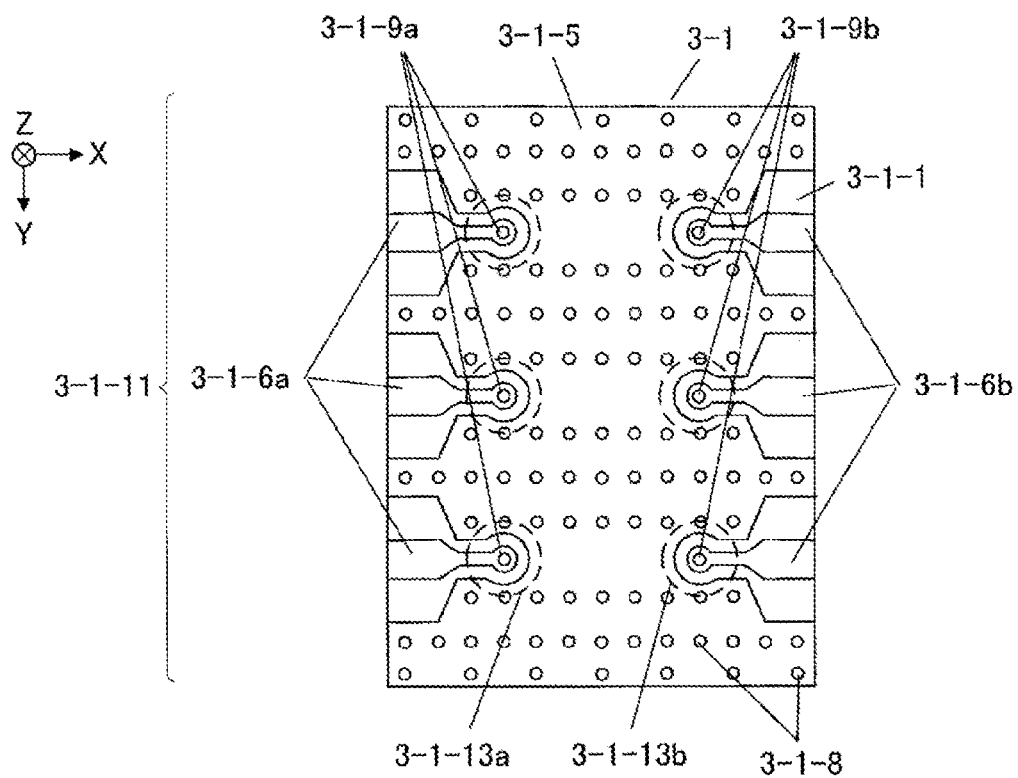
FIG. 11 is a bottom view of a high-frequency line substrate of the high-frequency line connecting structure according to the second embodiment of the present invention.
Figure 12:
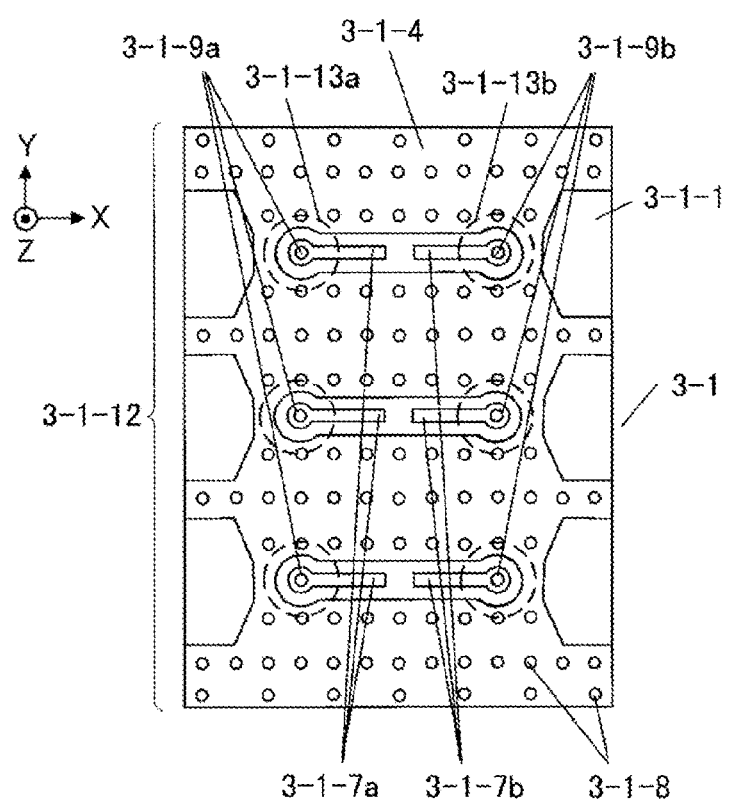
FIG. 12 is a plan view of the high-frequency line substrate of the high-frequency line connecting structure according to the second embodiment of the present invention.

A second embodiment of the present invention is described next. FIG. 9 is an exploded perspective view showing, from above, a high-frequency line connecting structure according to the second embodiment of the present invention. FIG. 10 is an exploded perspective view showing the high-frequency line connecting structure of FIG. 9 from below. FIG. 11 is a bottom view of the high-frequency line substrate. FIG. 12 is a plan view of the high-frequency line substrate. Note that, in FIG. 11, the descriptions of the signal lead pins and the ground lead pins are omitted in order to facilitate understanding of the configuration of the high-frequency line substrate. Also in FIG. 12, the description of the DC block capacitor is omitted in order to facilitate understanding of the configuration of the high-frequency line substrate.

Figure 13:
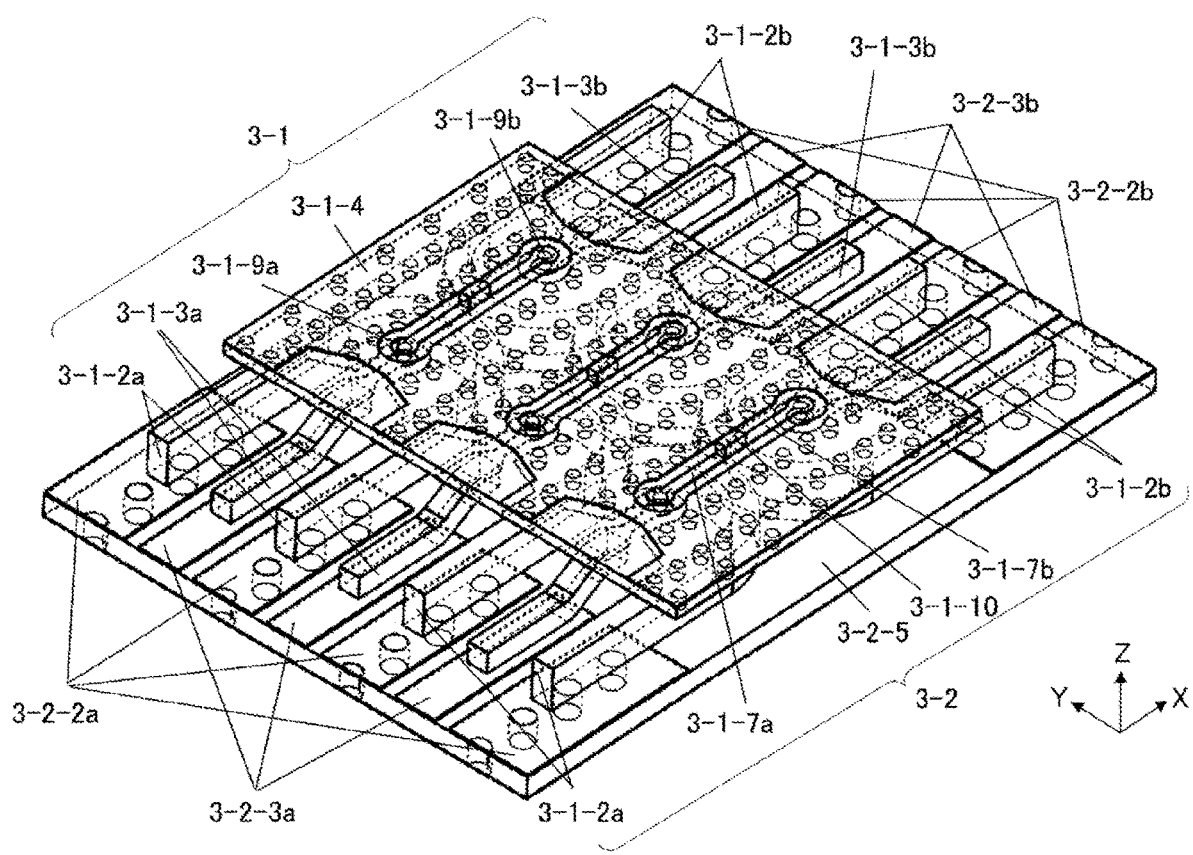
FIG. 13 is a perspective view of the high-frequency line connecting structure according to the second embodiment of the present invention.
Figure 14:
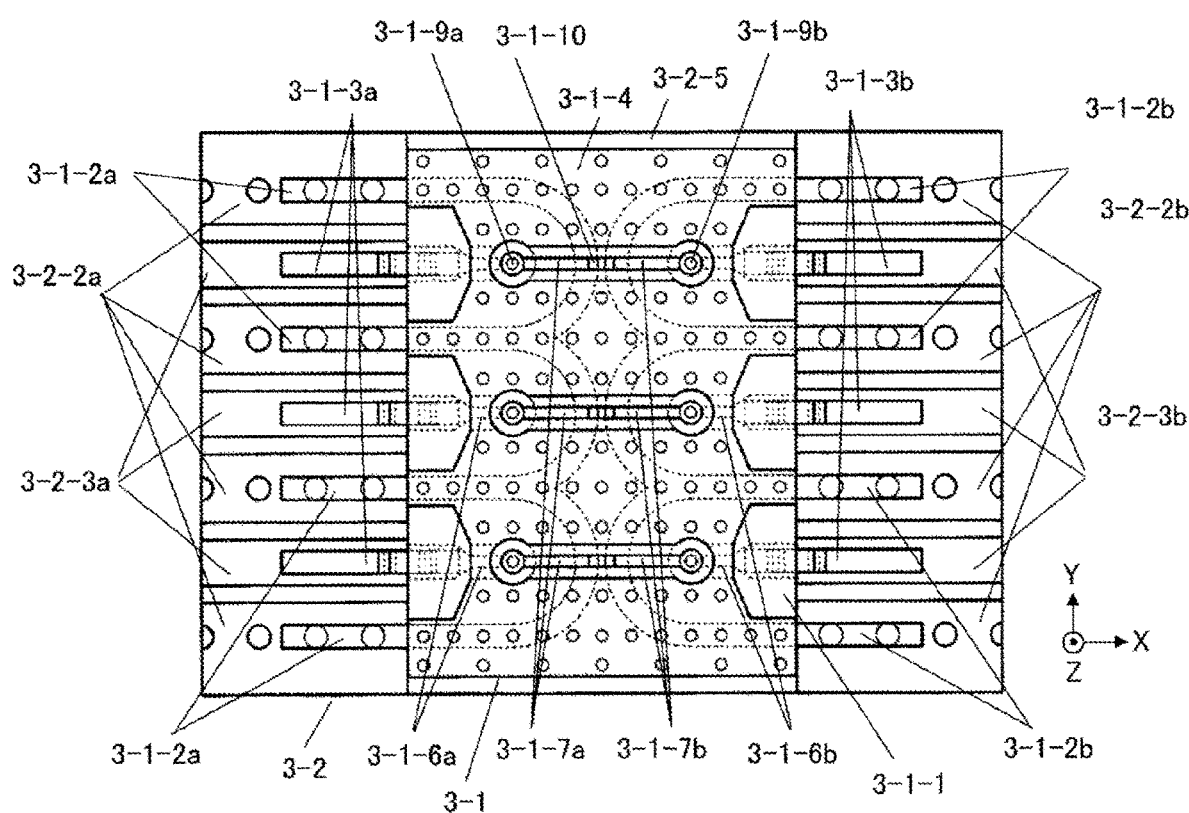
FIG. 14 is a plan view of the high-frequency line connecting structure according to the second embodiment of the present invention.
Figure 15:
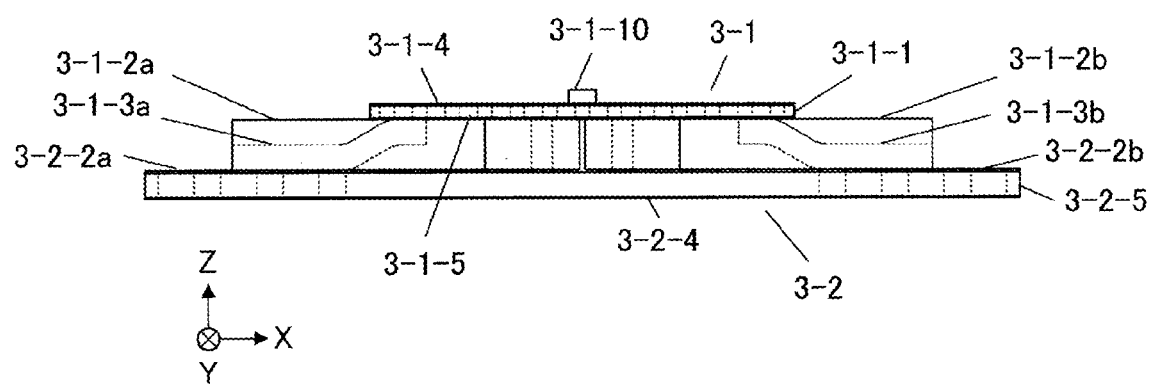
FIG. 15 is a side view of the high-frequency line connecting structure according to the second embodiment of the present invention.

FIG. 13 is a perspective view of the high-frequency line connecting structure in which a high-frequency line substrate is mounted on a printed circuit board, and a grounded coplanar line of the printed circuit board is connected by a grounded coplanar line of the high-frequency line substrate. FIG. 14 is a plan view of the high-frequency line connecting structure of FIG. 13, and FIG. 15 is a side view of the high-frequency line connecting structure of FIG. 13.

A printed circuit board 3-2 (first substrate) of the present embodiment includes a flat plate-shaped dielectric 3-2-5 (FIGS. 9, 13, and 15), signal lines 3-2-3a and 3-2-3b (first signal lines) shown in FIGS. 9, 13, and 14 made of conductors that are formed on an upper surface (first main surface) of the dielectric 3-2-5 (FIGS. 9, 13, and 15), ground planes 3-2-2a and 3-2-2b (first grounds) (FIGS. 9 and 13-15) made of conductors that are formed on the upper surface of the dielectric 3-2-5 (FIGS. 9, 13, and 15) along the signal lines 3-2-3a and 3-2-3b shown in FIGS. 9, 13, and 14, a ground plane 3-2-4 made of a conductor that is formed on a lower surface (second main surface) of the dielectric 3-2-5 (FIGS. 9, 13, and 15), and ground vias 3-2-6 (FIG. 9) made of conductors that connect the ground planes 3-2-2a and 3-2-2b (FIGS. 9 and 13-15) to the ground plane 3-2-4.

In the present embodiment, a plurality of the signal lines 3-2-3a shown in FIGS. 9, 13, and 14 are arranged in parallel. A plurality of the ground planes 3-2-2a (FIGS. 9 and 13-15) are arranged on both sides of the signal lines 3-2-3a (FIGS. 9, 13, and 14) along the signal lines 3-2-3a. Similarly, a plurality of the signal lines 3-2-3b (FIGS. 9, 13, and 14) are arranged in parallel. A plurality of ground planes 3-2-2b (FIGS. 9, and 13-15) are arranged on both sides of the signal lines 3-2-3b along the signal lines 3-2-3b.

The signal lines 3-2-3a and the signal lines 3-2-3b shown in FIGS. 9, 13, and 14 are divided at the position where a DC block capacitor is mounted as described hereinafter. Similarly, the ground planes 3-2-2a and the ground planes 3-2-2b shown in FIGS. 9 and 13-15 are divided at sections which are at the same position in the extension direction (X direction in FIGS. 9 to 15) as the sections where the signal lines 3-2-3a and 3-2-3b as shown in FIGS. 9, 13, and 14 are divided.

The ground planes 3-2-2a and 3-2-2b (FIGS. 9 and 13-15) are electrically connected to the ground plane 3-2-4 by the ground vias 3-2-6 (FIG. 9) formed on the dielectric 3-2-5 (FIGS. 9, 13, and 15).

The signal lines 3-2-3a and 3-2-3b (FIGS. 9, 13, and 14) and the ground planes 3-2-2a and 3-2-2b (FIGS. 9 and 13-15) constitute a grounded coplanar line 3-2-7 (first high-frequency line) (FIG. 9) having the ground plane 3-2-4 on a rear surface of the substrate. The grounded coplanar line 3-2-7 (FIG. 9) is divided at a section where the high-frequency line substrate is mounted, in order to insert the DC block capacitor in series as described hereinafter.

On the other hand, the high-frequency line substrate 3-1 (second substrate) includes a flat plate-shaped dielectric 3-1-1, signal lines 3-1-6a and 3-1-6b (second signal lines) shown in FIGS. 11 and 14 made of conductors that are formed on a lower surface (first main surface) of the dielectric 3-1-1 facing the printed circuit board 3-2 so that the extension direction becomes parallel to the extension direction of the signal lines 3-2-3a and 3-2-3b shown in FIGS. 9, 13, and 14 when the high-frequency line substrate 3-1 is mounted on the printed circuit board 3-2, a ground plane 3-1-5 (second ground) (FIGS. 10, 11, and 15) made of a conductor that is formed on the lower surface of the dielectric 3-1-1 facing the printed circuit board 3-2 so as to surround the signal line 3-1-6a and 3-1-6b (FIGS. 11 and 14), signal lines 3-1-7a and 3-1-7b (third signal lines) (FIGS. 9 and 12-14) made of conductors that are formed on an upper surface (second main surface) of the dielectric 3-1-1, and a ground plane 3-1-4 (third ground) (FIGS. 9 and 12-15) formed on the upper surface of the dielectric 3-1-1 so as to surround the signal lines 3-1-7a and 3-1-7b (FIGS. 9 and 12-14).

The high-frequency line substrate 3-1 further includes signal lead pins 3-1-3a and 3-1-3b (FIGS. 9, 10, and 13-15) made of conductors that are connected to the signal lines 3-1-6a and 3-1-6b (FIGS. 11 and 14) respectively so as to be in contact with the signal lines 3-2-3a and 3-2-3b shown in FIGS. 9, 13, and 14 when the high-frequency line substrate 3-1 is mounted on the printed circuit board 3-2, ground lead pins 3-1-2a and 3-1-2b (FIGS. 9, 10, and 13-15) made of conductors that are connected to both ends of the ground plane 3-1-5 (FIGS. 10, 11, and 15) respectively so as to be in contact with the ground planes 3-2-2a and 3-2-2b (FIGS. 9 and 13-15) when the high-frequency line substrate 3-1 is mounted on the printed circuit board 3-2, ground vias 3-1-8 (FIGS. 11 and 12) made of conductors that are formed on the dielectric 3-1-1 and connect the ground plane 3-1-4 (FIGS. 9 and 12-15) and the ground plane 3-1-5 (FIGS. 10, 11, and 15) to each other, vias 3-1-9a and 3-1-9b (FIGS. 9 and 11-14) made of conductors that are formed on the dielectric 3-1-1 and connect the signal lines 3-1-6a and 3-1-6b (FIGS.

11 and 14) and the signal lines 3-1-7*a* and 3-1-7*b* (FIGS. 9 and 12-14) to each other, and a DC block capacitor 3-1-10 (electronic component) (FIGS. 9 and 13-15).

Examples of the material of the dielectrics 3-1-1 and 3-2-5 include low-loss ceramics such as alumina.

In the present embodiment, a plurality of the signal lines 3-1-6*a* (FIGS. 11 and 14) are arranged in parallel on the lower surface of the high-frequency line substrate 3-1.

Similarly, a plurality of the signal lines 3-1-6*b* (FIGS. 11 and 14) are arranged in parallel. The ground planes 3-1-5 (FIGS. 10, 11, and 15) are arranged so as to surround the signal lines 3-1-6*a* and 3-1-6*b* (FIGS. 11 and 14). The signal lines 3-1-6*a* (FIGS. 11 and 14) and the signal lines 3-1-6*b* (FIGS. 11 and 14) are divided in order to mount the DC block capacitor 3-1-10 (FIGS. 9 and 13-15) on the opposite surface. The pitch of the signal lines 3-1-6*a* and 3-1-6*b* (FIGS. 11 and 14) in the alignment direction (Y direction in FIGS. 9 to 15) is the same as the pitch of the signal lines 3-2-3*a* and 3-2-3*b* shown in FIGS. 9, 13, and 14 in the alignment direction.

In the present embodiment, a plurality of the signal lines 3-1-7*a* (FIGS. 9 and 12-14) are arranged in parallel on the upper surface of the high-frequency line substrate 3-1. Similarly, a plurality of the signal lines 3-1-7*b* (FIGS. 9 and 12-14) are arranged in parallel. The ground planes 3-1-4 (FIGS. 9 and 12-15) are arranged so as to surround the signal lines 3-1-7*a* and 3-1-7*b* (FIGS. 9 and 12-14). The signal lines 3-1-7*a* (FIGS. 9 and 12-14) and the signal lines 3-1-7*b* (FIGS. 9 and 12-14) are divided in order to mount the DC block capacitor 3-1-10 (FIGS. 9 and 13-15) on the upper surface of the high-frequency line substrate 3-1. The pitch of the signal lines 3-1-7*a* and 3-1-7*b* (FIGS. 9 and 12-14) in the alignment direction (Y direction in FIGS. 9 to 15) is the same as the pitch of the signal lines 3-1-6*a* and 3-1-6*b* (FIGS. 11 and 14) in the alignment direction.

The ground planes 3-1-5 (FIGS. 10, 11, and 15) are electrically connected to the ground planes 3-1-4 (FIGS. 9 and 12-15) by the ground vias 3-1-8 (FIGS. 11 and 12) formed on the dielectric 3-1-1.

Ends of the signal lines 3-1-7*a* (FIGS. 9 and 12-14) are electrically connected to one of the two parts of the second signal line (signal line 3-1-6*a* shown in FIGS. 11 and 14) via the via 3-1-9*a* (FIGS. 9 and 11-14) formed in the dielectric 3-1-1. Ends of the signal lines 3-1-7*b* (FIGS. 9 and 12-14) are electrically connected to the other one of the two parts of the second signal line (signal line 3-1-6*b* shown in FIGS. 11 and 14) via the vias 3-1-9*b* (FIGS. 9 and 11-14) formed in the dielectric 3-1-1.

The ground planes 3-1-5 (FIGS. 10, 11, and 15) are formed around the signal lines 3-1-6*a* and 3-1-6*b* (FIGS. 11 and 14), and the ground planes 3-1-4 (FIGS. 9 and 12-15) are formed around the signal lines 3-1-7*a* and 3-1-7*b* (FIGS. 9 and 12-14). Thus, the signal lines 3-1-6*a* (FIGS. 11 and 14) and 3-1-7*a* (FIGS. 9 and 12-14), the vias 3-1-9*a* (FIGS. 9 and 11-14), and the ground planes 3-1-4 (FIGS. 9 and 12-15) and 3-1-5 (FIGS. 10, 11, and 15) constitute a pseudo-coaxial line structure 3-1-13*a* (FIGS. 11 and 12) formed along a vertical direction of the high-frequency line substrate 3-1 (dielectric 3-1-1). Similarly, the signal lines 3-1-6*b* (FIGS. 11 and 14) and 3-1-7*b* (FIGS. 9 and 12-14), the vias 3-1-9*b* (FIGS. 9 and 11-14), and the ground planes 3-1-4 (FIGS. 9 and 12-15) and 3-1-5 (FIGS. 10, 11, and 15) constitute a pseudo-coaxial line structure 3-1-13*b* (FIGS. 11 and 12).

The signal lines 3-1-6*a* and 3-1-6*b* (FIGS. 11 and 14) and the ground planes 3-1-5 (FIGS. 10, 11, and 15) constitute a grounded coplanar line 3-1-11 (second high-frequency line) (FIG. 11) having the ground planes 3-1-4 (FIGS. 9 and 12-15) on the opposite side with the dielectric 3-1-1 therebetween. The grounded coplanar line 3-1-11 (FIG. 11) is divided into two in order to insert the DC block capacitor 3-1-10 (FIGS. 9 and 13-15) in series.

The signal lines 3-1-7*a* and 3-1-7*b* (FIGS. 9 and 12-14) and the ground plane 3-1-4 (FIGS. 9 and 12-15) constitute a grounded coplanar line 3-1-12 (third high-frequency line) (FIG. 12) having the ground plane 3-1-5 (FIGS. 10, 11, and 15) on the opposite side with the dielectric 3-1-1 therebetween. The grounded coplanar line 3-1-12 (FIG. 12) is divided into two in order to insert the DC block capacitor 3-1-10 (FIGS. 9 and 13-15) in series.

One electrode of the DC block capacitor 3-1-10 (FIGS. 9 and 13-15) is soldered to one of the two divided sections of the third signal line (signal line 3-1-7*a* shown in FIGS. 9 and 12-14). The other electrode of the DC block capacitor 3-1-10 (FIGS. 9 and 13-15) is soldered to the other part (signal line 3-1-7*b* shown in FIGS. 9 and 12-14) of the two divided sections of the third signal line. In this manner, the DC block capacitor 3-1-10 (FIGS. 9 and 13-15) is mounted on the high-frequency line substrate 3-1 and the DC block capacitor 3-1-10 (FIGS. 9 and 13-15) is inserted in series into the grounded coplanar lines 3-1-11 (FIG. 11) and 3-1-12 (FIG. 12).

Examples of a method for fixing the signal lead pins 3-1-3*a* and 3-1-3*b* (FIGS. 9, 10, and 13-15) to the signal lines 3-1-6*a* and 3-1-6*b* (FIGS. 11 and 14) and a method for fixing the ground lead pins 3-1-2*a* and 3-1-2*b* (FIGS. 9, 10, and 13-15) to the ground planes 3-1-5 (FIGS. 10, 11, and 15) include brazing and soldering; needless to say, other fixing methods may be adopted.

After the high-frequency line substrate 3-1 and the printed circuit board 3-2 described above are individually prepared, the high-frequency line substrate 3-1 is mounted on the printed circuit board 3-2.

In order to prepare the high-frequency line connecting structure shown in FIGS. 13 to 15, the surface of the high-frequency line substrate 3-1 on which the signal lines 3-1-6*a* and 3-1-6*b* (FIGS. 11 and 14) and the ground planes 3-1-5 (FIGS. 10, 11, and 15) are formed is placed face-down so the signal lines 3-1-6*a* (FIGS. 11 and 14), 3-1-6*b* (FIGS. 11 and 14), 3-1-7*a* (FIGS. 9 and 12-14), and 3-1-7*b* (FIGS. 9 and 12-14) are positioned above the divided section of the signal lines 3-2-3*a* and 3-2-3*b* shown in FIGS. 9, 13, and 14 and the ground planes 3-1-5 (FIGS. 10, 11, and 15) and 3-1-4 (FIGS. 9 and 12-15) are positioned on the divided section of the ground planes 3-2-2*a* and 3-2-2*b* (FIGS. 9 and 13-15), and then the high-frequency line substrate 3-1 is mounted on the printed circuit board 3-2.

In so doing, the high-frequency line substrate 3-1 is mounted on the printed circuit board 3-2 in such a manner that the signal lead pins 3-1-3*a* and 3-1-3*b* (shown in FIGS. 9, 10, and 13-15) of the high-frequency line substrate 3-1 and the signal lines 3-2-3*a* and 3-2-3*b* (shown in FIGS. 9, 13, and 14) of the printed circuit board 3-2 come into contact with each other, and the ground lead pins 3-1-2*a* and 3-1-2*b* (FIGS. 9, 10, and 13-15) of the high-frequency line substrate 3-1 and the ground planes 3-2-2*a* and 3-2-2*b* (FIGS. 9 and 13-15) of the printed circuit board 3-2 come into contact with each other.

The signal lead pins 3-1-3*a* and 3-1-3*b* (shown in FIGS. 9, 10, and 13-15) of the high-frequency line substrate 3-1 and the signal lines 3-2-3*a* and 3-2-3*b* (shown in FIGS. 9, 13, and 14) of the printed circuit board 3-2 are connected by soldering or the like. Similarly, the ground lead pins 3-1-2*a* and 3-1-2*b* (FIGS. 9, 10, and 13-15) of the high-frequency line substrate 3-1 and the ground planes 3-2-2*a* and 3-2-2*b*

(FIGS. 9 and 13-15) of the printed circuit board 3-2 are connected by soldering or the like.

With the high-frequency line connecting structure described above, the signal line 3-2-3*a* shown in FIGS. 9, 13, and 14 of the printed circuit board 3-2 is electrically connected to the signal line 3-2-3*b* via the signal lead pin 3-1-3*a* (FIGS. 9, 10, and 13-15), the signal line 3-1-6*a* (FIGS. 11 and 14), the via 3-1-9*a* (FIGS. 9 and 11-14), the signal line 3-1-7*a* (FIGS. 9 and 12-14), the DC block capacitor 3-1-10 (FIGS. 9 and 13-15), the signal line 3-1-7*b* (FIGS. 9 and 12-14), the via 3-1-9*b* (FIGS. 9 and 11-14), the signal line 3-1-6*b* (FIGS. 11 and 14) and the signal lead pin 3-1-3*b* (FIGS. 9, 10, and 13-15) of the high-frequency line substrate 3-1.

The ground plane 3-2-2*a* (FIGS. 9 and 13-15) of the printed circuit board 3-2 is electrically connected to the ground plane 3-2-2*b* (FIGS. 9 and 13-15) via the ground lead pin 3-1-2*a* (FIGS. 9, 10, and 13-15), the ground plane 3-1-5 (FIGS. 10, 11, and 15), and the ground lead pin 3-1-2*b* (FIGS. 9, 10, and 13-15) of the high-frequency line substrate 3-1.

In this manner, the high-frequency line substrate 3-1 on which the DC block capacitor 3-1-10 (FIGS. 9 and 13-15) is mounted can be mounted on the printed circuit board 3-2, whereby the DC block capacitor 3-1-10 (FIGS. 9 and 13-15) can be inserted in series into the grounded coplanar lines 3-2-7 (FIG. 9).

In the present embodiment, as shown in FIG. 15, the shapes of the ground lead pins 3-1-2*a* and 3-1-2*b* (FIGS. 9, 10, and 13-15) and of the signal lead pins 3-1-3*a* and 3-1-3*b* (FIGS. 9, 10, and 13-15) are determined in such a manner that the height of the ground lead pins 3-1-2*a* and 3-1-2*b* (FIGS. 9, 10, and 13-15) from the upper surface of the printed circuit board 3-2 is greater than that of the signal lead pins 3-1-3*a* and 3-1-3*b* (FIGS. 9, 10, and 13-15) at the contact portions between the signal lead pins 3-1-3*a* and 3-1-3*b* (FIGS. 9, 10, and 13-15) and the signal lines 3-2-3*a* and 3-2-3*b* shown in FIGS. 9, 13, and 14, and the contact portions between the ground lead pins 3-1-2*a* and 3-1-2*b* (FIGS. 9, 10, and 13-15) and the ground planes 3-2-2*a* and 3-2-2*b* (FIGS. 9 and 13-15).

As is clear from FIG. 15, needless to say, the height of upper surfaces of the signal lead pins 3-1-3*a* and 3-1-3*b* (FIGS. 9, 10, and 13-15) at the connection portions between the signal lead pins 3-1-3*a* and 3-1-3*b* (FIGS. 9, 10, and 13-15) and the signal lines 3-1-6*a* and 3-1-6*b* (FIGS. 11 and 14) is the same as the height of the upper surfaces of the ground lead pins 3-1-2*a* and 3-1-2*b* (FIGS. 9, 10, and 13-15) at the connection portions between the ground lead pins 3-1-2*a* and 3-1-2*b* (FIGS. 9, 10, and 13-15) and the ground planes 3-1-5 (FIGS. 10, 11, and 15). The signal lead pins 3-1-3*a* and 3-1-3*b* (FIGS. 9, 10, and 13-15) are shaped such that the upper surfaces thereof become lower in height from the high-frequency line substrate 3-1 toward the signal lines 3-2-3*a* and 3-2-3*b* shown in FIGS. 9, 13, and 14.

A high-frequency signal propagates from the printed circuit board 3-2 to the high-frequency line substrate 3-1 through the signal lead pin 3-1-3*a* (FIGS. 9, 10, and 13-15). Furthermore, a high-frequency signal propagates from the high-frequency line substrate 3-1 to the printed circuit board 3-2 through the signal lead pin 3-1-3*b* (FIGS. 9, 10, and 13-15). In such a case, since the signal lead pins 3-1-3*a* and 3-1-3*b* (FIGS. 9, 10, and 13-15) are exposed to air, the capacitance between the signal lead pins 3-1-3*a* and 3-1-3*b* (FIGS. 9, 10, and 13-15) and the ground lead pins 3-1-2*a* and 3-1-2*b* (FIGS. 9, 10, and 13-15) decreases, and the characteristic impedance of the coplanar line tends to increase.

In the present embodiment, at the contact portions between the signal lead pins 3-1-3*a* and 3-1-3*b* shown in FIGS. 9, 10, and 13-15 and the signal lines 3-2-3*a* and 3-2-3*b* shown in FIGS. 9, 13, and 14, and the contact portions between the ground lead pins 3-1-2*a* and 3-1-2*b* (FIGS. 9, 10, and 13-15) and the ground planes 3-2-2*a* and 3-2-2*b* (FIGS. 9 and 13-15), the height of the ground lead pins 3-1-2*a* and 3-1-2*b* (FIGS. 9, 10, and 13-15) is made greater than that of the signal lead pins 3-1-3*a* and 3-1-3*b* (FIGS. 9, 10, and 13-15). Thus, a structure is obtained in which the signal lead pins 3-1-3*a* and 3-1-3*b* (FIGS. 9, 10, and 13-15) are surrounded by the ground lead pins 3-1-2*a* and 3-1-2*b* (FIGS. 9, 10, and 13-15) that each function as the ground of the coplanar line.

With this structure, in the present embodiment, not only is it possible to prevent a decrease in capacitance between the signal lead pins 3-1-3*a* and 3-1-3*b* (FIGS. 9, 10, and 13-15) and the ground lead pins 3-1-2*a* and 3-1-2*b* (FIGS. 9, 10, and 13-15), but also an increase in the characteristic impedance of the coplanar lines can be suppressed. As a result, impedance matching can be achieved between the grounded coplanar line 3-2-7 (FIG. 9) of the printed circuit board 3-2 and the grounded coplanar lines 3-1-11 (FIG. 11) and 3-1-12 (FIG. 12) of the high-frequency line substrate 3-1.

In addition, in the present embodiment, the ground lead pins 3-1-2*a* and 3-1-2*b* (FIGS. 9, 10, and 13-15) can enclose a line of electric force from the signal lead pins 3-1-3*a* and 3-1-3*b* (FIGS. 9, 10, and 13-15) so as not to allow the line of electric force to reach the adjacent signal lead pins 3-1-3*a* and 3-1-3*b* (FIGS. 9, 10, and 13-15). As a result, crosstalk between the signal lead pins 3-1-3*a* and 3-1-3*b* (FIGS. 9, 10, and 13-15) and the adjacent signal lead pins 3-1-3*a* and 3-1-3*b* (FIGS. 9, 10, and 13-15) can be reduced.

Figure 16:
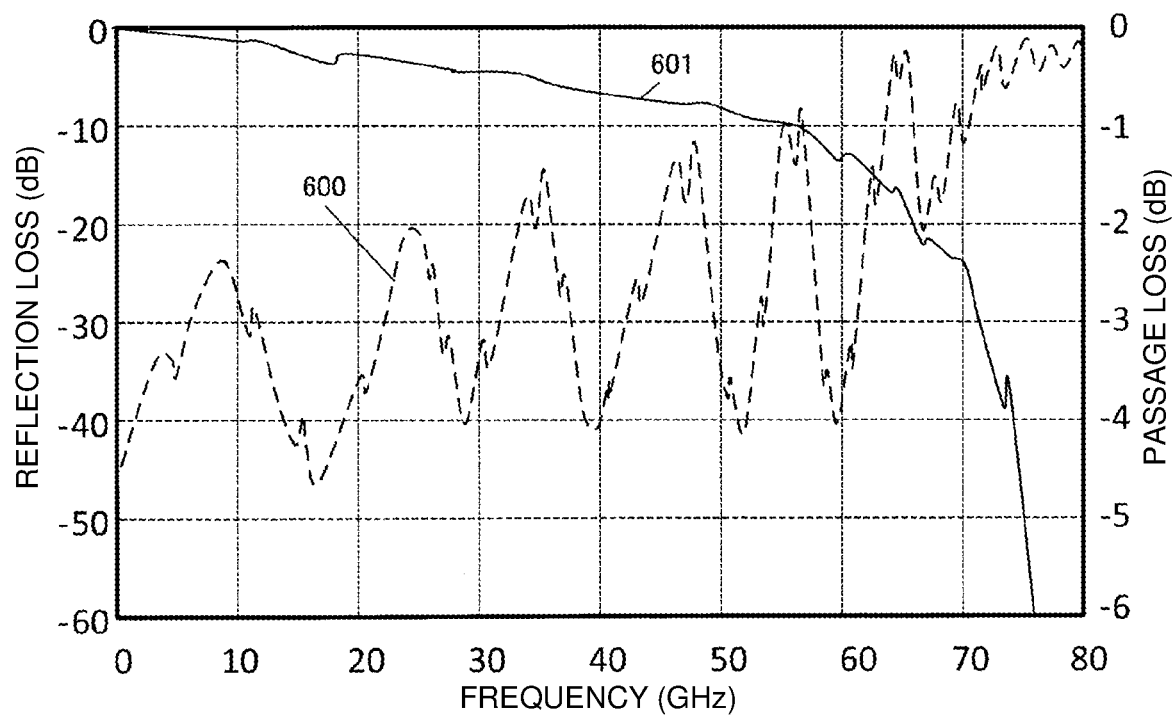
FIG. 16 is a diagram illustrating simulation results of reflection loss characteristics and passage loss characteristics of the high-frequency line connecting structure according to the second embodiment of the present invention.
Figure 17:
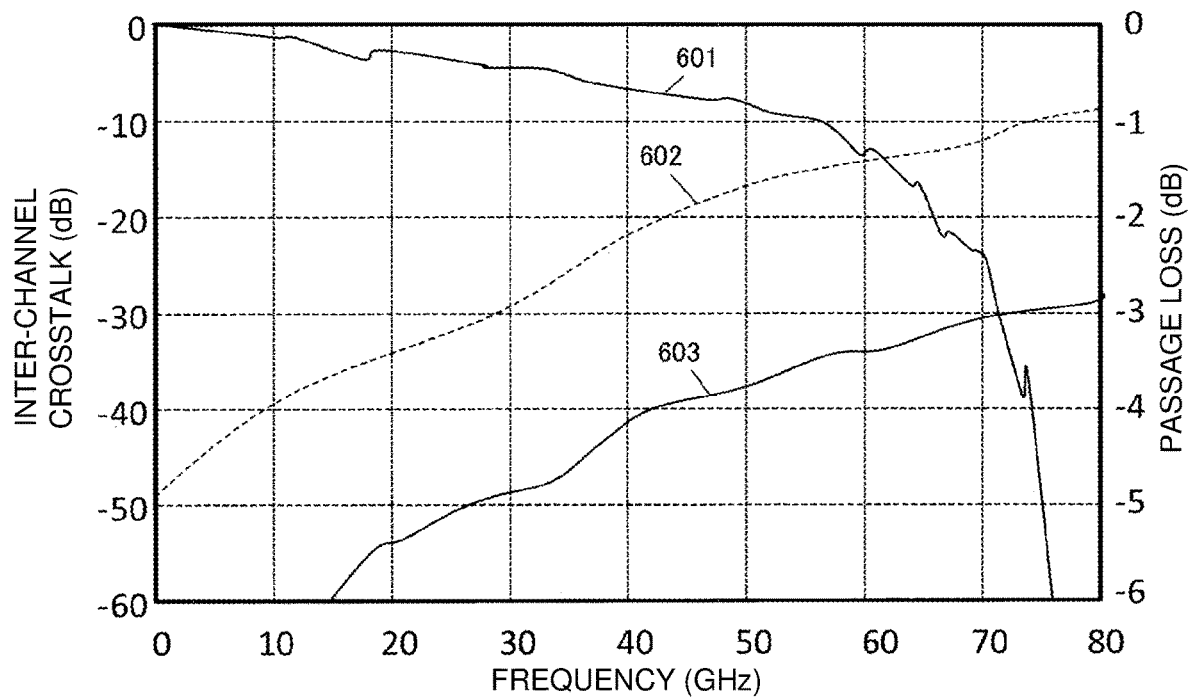
FIG. 17 is a diagram illustrating simulation results of crosstalk characteristics between adjacent channels and passage loss characteristics of the high-frequency line connecting structure according to the second embodiment of the present invention.
Figure 18A:
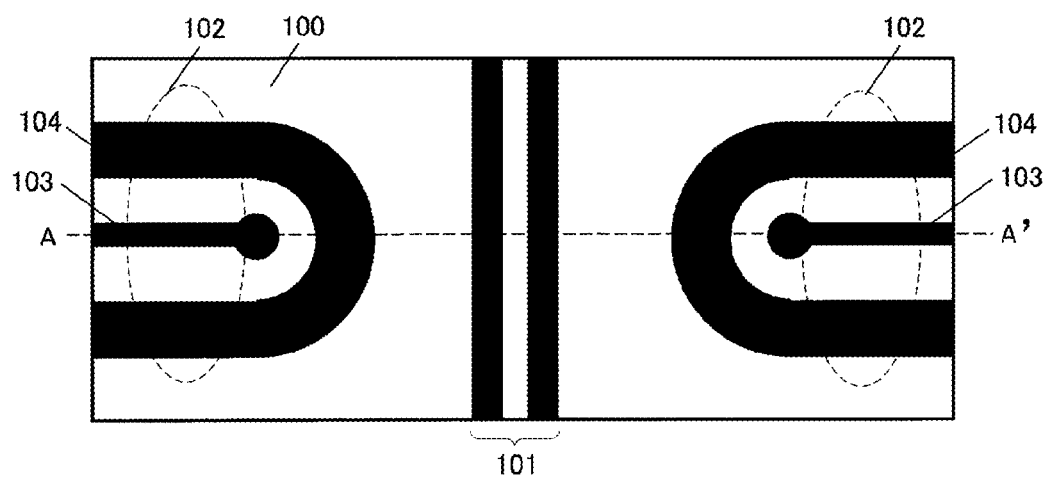
FIG. 18A is a plan view of a multilayer printed circuit board of the prior art.
Figure 18B:
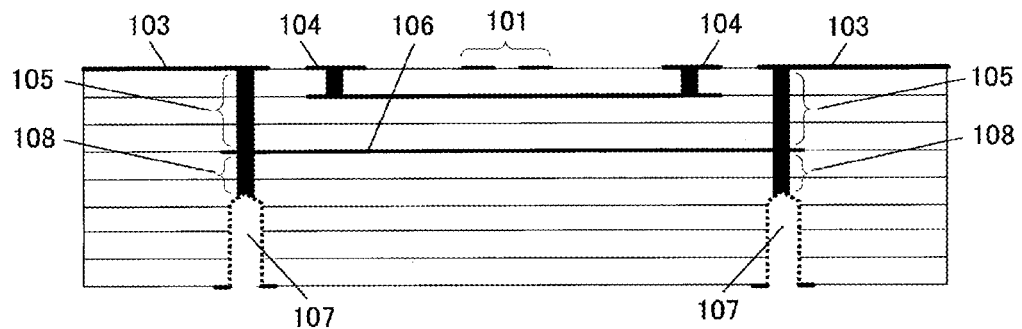
FIG. 18B is a cross-sectional view of the multilayer printed circuit board of the prior art.
Figure 19:
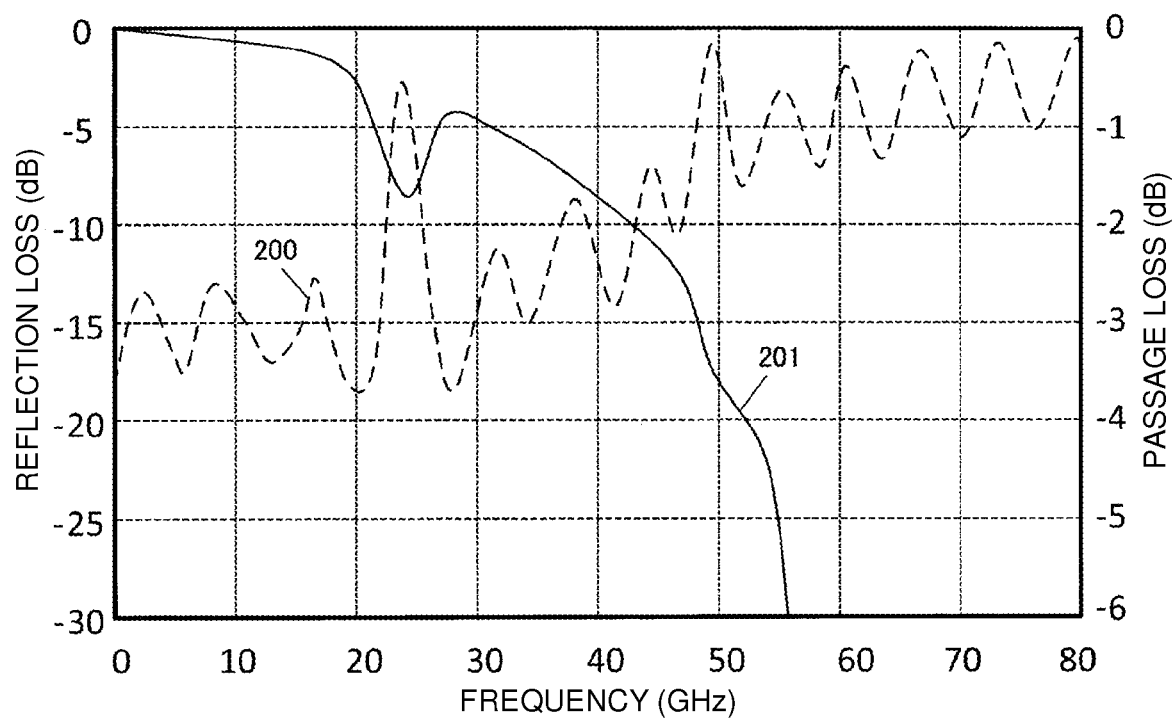
FIG. 19 is a diagram illustrating reflection loss characteristics and passage loss characteristics of the multilayer printed circuit board of the prior art.

FIG. 16 is a diagram illustrating simulation results of reflection loss characteristics in dB and passage loss characteristics in dB of the grounded coplanar line in the high-frequency line connecting structure of the present embodiment at different frequencies ("FREQUENCY (GHz)"), and FIG. 17 is a diagram showing simulation results of inter-channel crosstalk characteristics in dB between adjacent channels and passage loss characteristics in dB of the grounded coplanar line in the high-frequency line connecting structure of the present embodiment at different frequencies ("FREQUENCY (GHz)").

Reference numeral 600 in FIG. 16 indicates the reflection loss characteristics, and reference numeral 601 in FIGS. 16 and 17 indicates the passage loss characteristics. Reference numeral 602 of FIG. 17 indicates an inter-channel crosstalk between adjacent channels occurring when the shape of the ground lead pins 3-1-2*a* and 3-1-2*b* (FIGS. 9, 10, and 13-15) is identical to that of the signal lead pins 3-1-3*a* and 3-1-3*b* (FIGS. 9, 10, and 13-15), and reference numeral 603 indicates a crosstalk between adjacent channels in the present embodiment.

In the present embodiment, by mounting the high-frequency line substrate 3-1 onto the printed circuit board 3-2, the DC block capacitor 3-1-10 (FIGS. 9 and 13-15) is inserted in series into the grounded coplanar line 3-2-7 (FIG. 9). Also in the present embodiment, by making the ground lead pins 3-1-2*a* and 3-1-2*b* (FIGS. 9, 10, and 13-15) at the connection portion with the printed circuit board 3-2 higher than the signal lead pins 3-1-3*a* and 3-1-3*b* (FIGS. 9, 10, and 13-15), impedance matching can be achieved between the grounded coplanar line 3-2-7 (FIG. 9) of the printed circuit board 3-2 and the grounded coplanar lines 3-1-11 (FIG. 11) and 3-1-12 (FIG. 12) of the high-frequency line substrate 3-1.

As a result, in the present embodiment, the high-frequency line connecting structure capable of achieving favorable effects as shown in FIGS. 16 and 17 and realizing low reflection loss characteristics, low passage loss characteristics, and low crosstalk characteristics in a wide bandwidth can be obtained.

Note that, in the present embodiment, the DC block capacitor is described as an example of the electronic component to be inserted in series into the coplanar line, but an electronic component other than the DC block capacitor may be used.

In the first and second embodiments, the dielectric 2-1-1 (FIGS. 1, 2, and 6), 2-1-7 (FIGS. 2, 3, and 6), 2-2-5 (FIGS. 1, 2, and 4-6), 3-1-1, and 3-2-5 (FIGS. 9, 13, and 15) constituting the grounded coplanar lines 2-1-9 (FIG. 3), 2-2-7 (FIG. 1), 3-1-11 (FIG. 11), 3-1-12 (FIG. 12), and 3-2-7 (FIG. 9) are low-loss ceramics such as alumina, but needless to say, liquid crystal polymer, polymide, quartz glass, or the like can be used instead.

Also, in the first and second embodiments, when mounting the high-frequency line substrates 2-1 and 3-1 on the printed circuit boards 2-2 and 3-2, the connection portions between the signal lead pins 2-1-3a (FIGS. 1, 2, and 4-6), 2-1-3b (FIGS. 1, 2, and 4-6), 3-1-3a (FIGS. 9, 10, and 13-15), and 3-1-3b (FIGS. 9, 10, and 13-15) and the signal lines 2-2-3a (FIGS. 1, 4, and 5), 2-2-3b (FIGS. 1, 4, and 5), 3-2-3a (FIGS. 9, 13, and 14), and 3-2-3b (FIGS. 9, 13, and 14), the connection portions between the ground lead pins 2-1-2a (FIGS. 1, 2, and 4-6), 2-1-2b (FIGS. 1, 2, and 4-6), 3-1-2a (FIGS. 9, 10, and 13-15), and 3-1-2b (FIGS. 9, 10, and 13-15) and the ground planes 2-2-2a (FIGS. 1 and 4-6), 2-2-2b (FIGS. 1 and 4-6), 3-2-2a (FIGS. 9 and 13-15), and 3-2-2b (FIGS. 9 and 13-15), the connection portions between the signal lead pins 2-1-3a (FIGS. 1, 2, and 4-6), 2-1-3b (FIGS. 1, 2, and 4-6), 3-1-3a (FIGS. 9, 10, and 13-15), and 3-1-3b (FIGS. 9, 10, and 13-15) and the signal lines 2-1-6 (FIGS. 2, 3, and 5), 3-1-6a (FIGS. 11 and 14), and 3-1-6b (FIGS. 11 and 14), and the connection portions between the ground lead pins 2-1-2a (FIGS. 1, 2, and 4-6), 2-1-2b (FIGS. 1, 2, and 4-6), 3-1-2a (FIGS. 9, 10, and 13-15), and 3-1-2b (FIGS. 9, 10, and 13-15) and the ground planes 2-1-5 (FIGS. 2, 3, 5, and 6) and 3-1-5 (FIGS. 10, 11, and 15) are typically gold-plated for the purpose of improving solder wettability. However, gold plating is not specified in particular because it is not the essence of the present invention.

INDUSTRIAL APPLICABILITY

Embodiments of the present invention can be applied to a technique for three-dimensionally crossing high-frequency lines of a printed circuit board and inserting electronic components into the high-frequency lines of the printed circuit board.

REFERENCE SIGNS LIST 2-1, 3-1 High-frequency line substrate
2-1-1, 2-2-5, 3-1-1, 3-2-5 Dielectric
2-1-2a, 2-1-2b, 3-1-2a, 3-1-2b Ground lead pin
2-1-3a, 2-1-3b, 3-1-3a, 3-1-3b Signal lead pin
2-1-4, 2-1-5, 2-2-2b, 2-2-2b, 2-2-4, 3-1-4, 3-1-5, 3-2-2, 3-2-2b Ground plane
2-1-6, 2-2-3a, 2-2-3b, 3-1-6a, 3-1-6b, 3-1-7a, 3-1-7b, 3-2-3a, 3-2-3b Signal line
2-1-7 Dielectric
2-1-8, 2-2-6, 3-2-6, 3-1-8 Ground via
2-1-9, 2-2-7, 3-1-11, 3-1-12, 3-2-7 Grounded coplanar line
2-2, 3-2 Printed circuit board
2-2-1 Microstrip line
3-1-9a, 3-1-9b Via
3-1-10 DC block capacitor
3-1-13a, 3-1-13b Pseudo-coaxial line structure

The invention claimed is:
1. A method of forming a high-frequency line connecting structure, the method comprising:
  forming a first substrate comprising a first high-frequency line, the first high-frequency line comprising:
    a first signal line disposed on a first main surface of the first substrate, the first signal line being divided into a first part and a second part in a first section; and
    a first ground disposed on the first main surface of the first substrate along the first signal line, the first ground being divided into a first part and a second part in a second section, the second section being at a same position in an extension direction as the first section where the first signal line is divided; and
  mounting a second substrate on the first substrate, the second substrate comprising:
    a second high-frequency line comprising:
      a second signal line disposed on a first main surface of the second substrate facing the first substrate so that an extension direction of the second signal line is parallel to an extension direction of the first signal line; and
      a second ground disposed on the first main surface of the second substrate along the second signal line so that an extension direction of the second ground is parallel to an extension direction of the first ground; and
    a lead pin comprising a conductor electrically connecting the first high-frequency line and the second high-frequency line, the lead pin comprising:
      signal lead pins connected to both ends of the second signal line respectively so as to be in contact with the first part of the first signal line and the second part of the first signal line, in a state in which the second substrate is mounted on the first substrate, such that the second signal line is positioned on the first section of the first signal line and the second ground is positioned on the second section of the first ground; and
      ground lead pins connected to both ends of the second ground respectively so as to be in contact with the first part of the first ground and the second part of the first ground,
    wherein the signal lead pins include a third part connected to the second signal line and a fourth part that does not face the second signal line,
    wherein the ground lead pins include a fifth part connected to the second ground and a sixth part that does not face the second ground,
    wherein a height of the ground lead pins from the first main surface of the first substrate at the fifth part is equal to a height of the signal lead pins at the third part, and wherein a height of the ground lead pins from the first main surface of the first substrate at the sixth part is greater than a height of the signal lead pins at the fourth part.

2. The method according to claim 1, further comprising:
providing the first signal line in plural and arranging the first signal lines of the first high-frequency line in parallel;
providing the first ground in plural and arranging the first grounds of the first high-frequency line on both sides of the first signal lines along the first signal lines;
providing the second signal line in plural and arranging the second signal lines of the second high-frequency line in parallel;
providing the second ground in plural and arranging the second grounds of the second high-frequency line on both sides of the second signal lines along the second signal lines;
arranging the signal lead pins in parallel along an alignment direction of the first signal lines and the second signal lines; and
arranging the ground lead pins in parallel along an alignment direction of the first grounds and the second grounds.

3. The method according to claim 1, wherein the second substrate further comprises:
a third high-frequency line disposed on a second main surface of the second substrate, the second main surface being on a side opposite to the first main surface, the third high-frequency line comprising:
a third signal line disposed on the second main surface of the second substrate, the third signal line being divided into a first part and a second part in a third section; and
a third ground disposed on the second main surface of the second substrate so as to surround the third signal line; and
an electronic component mounted on the second main surface of the second substrate and inserted in series with the third high-frequency line, the electronic component comprising two electrodes connected to the first part of the third signal line and the second part of the third signal line, respectively.

4. The method according to claim 3, wherein:
the second signal line of the second high-frequency line is divided into a first part and a second part in a fourth section; and
the second ground of the second high-frequency line surrounds the second signal line.

5. The method according to claim 4, further comprising connecting both ends of the third signal line to the first part of the second signal line and the second part of the second signal line, respectively, by vias disposed on the second substrate.

6. The method according to claim 3, further comprising:
providing the first signal line in plural and arranging the first signal lines of the first high-frequency line in parallel;
providing the first ground in plural and arranging the first grounds of the first high-frequency line on both sides of the first signal lines along the first signal lines;
providing the second signal line in plural and arranging the second signal lines of the second high-frequency line in parallel;
providing the second ground in plural and arranging the second grounds of the second high-frequency line to surround the second signal lines;
providing the third signal line in plural and arranging the third signal lines of the third high-frequency line in parallel;
arranging the third ground of the third high-frequency line to surround the third signal lines;
providing the electronic component for each of the third signal lines;
arranging the signal lead pins in parallel along an alignment direction of the first signal lines, the second signal lines, and the third signal lines; and
arranging the ground lead pins in parallel along an alignment direction of the first grounds and the second grounds.

7. The method according to claim 3, wherein the electronic component comprises a DC block capacitor.

8. A high-frequency line connecting structure comprising:
a first substrate comprising a first high-frequency line, the first high-frequency line comprising:
a first signal line disposed on a first main surface of the first substrate, the first signal line being divided into a first part and a second part in a first section; and
a first ground disposed on the first main surface of the first substrate along the first signal line, the first ground being divided into a first part and a second part in a second section, the second section being at a same position in an extension direction as the first section where the first signal line is divided; and
a second substrate mounted on the first substrate, the second substrate comprising:
a second high-frequency line comprising:
a second signal line disposed on a first main surface of the second substrate facing the first substrate so that an extension direction of the second signal line is parallel to an extension direction of the first signal line; and
a second ground disposed on the first main surface of the second substrate along the second signal line so that an extension direction of the second ground is parallel to an extension direction of the first ground; and
a lead pin comprising a conductor electrically connecting the first high-frequency line and the second high-frequency line, the lead pin comprising:
signal lead pins connected to both ends of the second signal line respectively so as to be in contact with the first part of the first signal line and the second part of the first signal line, in a state in which the second substrate is mounted on the first substrate, such that the second signal line is positioned on the first section of the first signal line and the second ground is positioned on the second section of the first ground; and
a third high-frequency line disposed on a second main surface of the second substrate, the second main surface being on a side opposite to the first main surface, the third high-frequency line comprising:
a third signal line disposed on the second main surface of the second substrate, the third signal line being divided into a first part and a second part in a third section; and
a third ground disposed on the second main surface of the second substrate so as to surround the third signal line; and
an electronic component mounted on the second main surface of the second substrate and inserted in series with the third high-frequency line, the electronic component comprising two electrodes connected to the first part of the third signal line and the second part of the third signal line, respectively.

9. The high-frequency line connecting structure according to claim 8, wherein:
the second signal line of the second high-frequency line is divided into a first part and a second part in a fourth section;
the second ground of the second high-frequency line surrounds the second signal line; and
both ends of the third signal line are connected to the first part of the second signal line and the second part of the second signal line, respectively, by vias disposed on the second substrate.

10. The high-frequency line connecting structure according to claim 9, wherein the electronic component comprises a DC block capacitor.

11. The high-frequency line connecting structure according to claim 9, wherein:
the first signal line is provided in plural and the first signal lines of the first high-frequency line are arranged in parallel;
the first ground is provided in plural and the first grounds of the first high-frequency line are arranged on both sides of the first signal lines along the first signal lines;
the second signal line is provided in plural and the second signal lines of the second high-frequency line are arranged in parallel;
the second ground is provided in plural and the second grounds of the second high-frequency line surround the plurality of the second signal lines;
the third signal line is provided in plural and the third signal lines of the third high-frequency line are arranged in parallel;
the third ground of the third high-frequency line surrounds the third signal lines;
the electronic component is provided for each of the third signal lines;
the signal lead pins are arranged in parallel along an alignment direction of the first signal lines, the second signal lines, and the third signal lines; and
ground lead pins are arranged in parallel along an alignment direction of the first grounds and the second grounds.

12. A high-frequency line connecting structure comprising:
a first substrate comprising a first high-frequency line, the first high-frequency line comprising:
a first signal line disposed on a first main surface of the first substrate, the first signal line being divided into a first part and a second part in a first section; and
a first ground disposed on the first main surface of the first substrate along the first signal line, the first ground being divided into a first part and a second part in a second section, the second section being at a same position in an extension direction as the first section where the first signal line is divided; and
a second substrate mounted on the first substrate, the second substrate comprising:
a second high-frequency line comprising:
a second signal line disposed on a first main surface of the second substrate facing the first substrate so that an extension direction of the second signal line is parallel to an extension direction of the first signal line; and
a second ground disposed on the first main surface of the second substrate along the second signal line so that an extension direction of the second ground is parallel to an extension direction of the first ground; and
a lead pin comprising a conductor electrically connecting the first high-frequency line and the second high-frequency line, the lead pin comprising:
signal lead pins connected to both ends of the second signal line respectively so as to be in contact with the first part of the first signal line and the second part of the first signal line, in a state in which the second substrate is mounted on the first substrate, such that the second signal line is positioned on the first section of the first signal line and the second ground is positioned on the second section of the first ground; and
ground lead pins connected to both ends of the second ground respectively so as to be in contact with the first part of the first ground and the second part of the first ground,
wherein the signal lead pins include a third part connected to the second signal line and a fourth part that does not face the second signal line,
wherein the ground lead pins include a fifth part connected to the second ground and a sixth part that does not face the second ground,
wherein a height of the ground lead pins from the first main surface of the first substrate at the fifth part is equal to a height of the signal lead pins at the third part, and
wherein a height of the ground lead pins from the first main surface of the first substrate at the sixth part is greater than a height of the signal lead pins at the fourth part.

13. The high-frequency line connecting structure according to claim 12, wherein:
the first signal line is provided in plural and the first signal lines of the first high-frequency line are arranged in parallel;
the first ground is provided in plural and the first grounds of the first high-frequency line are arranged on both sides of the first signal lines along the first signal lines;
a plurality of the second signal lines of the second high-frequency line are arranged in parallel;
the second signal line is provided in plural and the second grounds of the second high-frequency line are arranged on both sides of the second signal lines along the second signal lines;
the signal lead pins are arranged in parallel along an alignment direction of the first signal lines and the second signal lines; and
the ground lead pins are arranged in parallel along an alignment direction of the first grounds and the second grounds.

* * * * *